US011939658B2

United States Patent
Miyatani et al.

(10) Patent No.: US 11,939,658 B2
(45) Date of Patent: Mar. 26, 2024

(54) DEPOSITION MASK, DEPOSITION MASK APPARATUS, DEPOSITION APPARATUS, AND MANUFACTURING METHOD FOR ORGANIC DEVICE

(71) Applicant: Dai Nippon Printing Co., Ltd., Tokyo (JP)

(72) Inventors: Isao Miyatani, Tokyo (JP); Chikao Ikenaga, Tokyo (JP); Yoko Nakamura, Tokyo (JP); Isao Inoue, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 17/658,101

(22) Filed: Apr. 6, 2022

(65) Prior Publication Data

US 2022/0325397 A1 Oct. 13, 2022

(30) Foreign Application Priority Data

Apr. 9, 2021 (JP) .................................. 2021-066651
Mar. 28, 2022 (JP) .................................. 2022-052480

(51) Int. Cl.
*C23C 14/04* (2006.01)

(52) U.S. Cl.
CPC .................................. *C23C 14/042* (2013.01)

(58) Field of Classification Search
None
See application file for complete search history.

(56) References Cited

U.S. PATENT DOCUMENTS

| | | | | |
|---|---|---|---|---|
| 8,646,405 | B2 * | 2/2014 | An | B05B 12/20 |
| | | | | 118/504 |
| 8,859,438 | B2 * | 10/2014 | Sonoda | C23C 14/12 |
| | | | | 438/758 |
| 9,055,653 | B2 * | 6/2015 | Sonoda | C23C 14/042 |
| 9,391,275 | B2 * | 7/2016 | Sonoda | C23C 14/042 |
| 9,394,600 | B2 * | 7/2016 | Han | C23C 14/042 |
| 9,580,791 | B2 * | 2/2017 | Inoue | C23F 1/02 |
| 9,947,904 | B2 * | 4/2018 | Sonoda | C23C 14/042 |
| 11,279,999 | B2 * | 3/2022 | Aoki | C23C 14/24 |
| 11,313,026 | B2 * | 4/2022 | Ikenaga | H10K 50/00 |
| 11,566,316 | B2 * | 1/2023 | Higuchi | H01L 21/28506 |
| 2016/0336544 | A1 * | 11/2016 | Sonoda | H10K 71/166 |
| 2018/0209039 | A1 * | 7/2018 | Ochi | C23C 14/24 |
| 2019/0203338 | A1 * | 7/2019 | Kawasaki | H10K 50/11 |

(Continued)

FOREIGN PATENT DOCUMENTS

JP 2005-183153 A 7/2005
JP 2019-060028 A 4/2019

*Primary Examiner* — Jethro M. Pence
(74) *Attorney, Agent, or Firm* — BURR PATENT LAW, PLLC

(57) ABSTRACT

A deposition mask according to an embodiment of the present disclosure includes a first surface, a second surface that is located opposite the first surface, and two or more through-holes. Each of the through-holes includes a first recess that is located at the first surface and a second recess that is located at the second surface. The deposition mask has a first mask region having a first surface remaining ratio that represents a remaining area ratio of the second surface and a second mask region having a second surface remaining ratio that represents a remaining area ratio of the second surface and that is higher than the first surface remaining ratio.

17 Claims, 16 Drawing Sheets

(56) References Cited

U.S. PATENT DOCUMENTS

| | | | |
|---|---|---|---|
| 2019/0256965 A1* | 8/2019 | Ikenaga | C23C 16/04 |
| 2021/0036066 A1* | 2/2021 | Luo | H10K 71/166 |
| 2021/0102268 A1* | 4/2021 | Oka | C21D 8/0247 |
| 2021/0214837 A1* | 7/2021 | Ikenaga | C23F 1/02 |
| 2021/0348265 A1* | 11/2021 | Okamoto | C23C 14/52 |
| 2022/0205077 A1* | 6/2022 | Ikenaga | B05C 21/005 |
| 2022/0209124 A1* | 6/2022 | Nakamura | H10K 50/805 |

* cited by examiner

DEPOSITION MASK, DEPOSITION MASK APPARATUS, DEPOSITION APPARATUS, AND MANUFACTURING METHOD FOR ORGANIC DEVICE

CROSS REFERENCES TO RELATED APPLICATIONS

This application is based upon and claims the benefit of priority from Japanese Patent Application No. 2021-066651 filed on Apr. 9, 2021 and Japanese Patent Application No. 2022-052480 filed on Mar. 28, 2022, the entire contents of which are incorporated herein by reference.

FIELD

Embodiments of the present disclosure relate to a deposition mask, a deposition mask apparatus, a deposition apparatus, and a manufacturing method for an organic device.

BACKGROUND

For electronic devices such as smart phones or tablet PCs, there is a need for high-definition display devices in markets. A display device has a pixel density of, for example, 400 ppi or more or 800 ppi or more.

An organic electroluminescent display device that has excellent responsiveness and/or sharp contrast attracts attention as such a display device. A known method of forming pixels of the organic electroluminescent display device is to deposit the material of the pixels on a substrate. In this case, a deposition mask apparatus that includes a deposition mask that has through-holes and a frame that supports the deposition mask is first prepared. Subsequently, a deposition material such as an organic material or an inorganic material is deposited with the deposition mask being in close contact with the substrate in a deposition apparatus. Consequently, the deposition material is attached to the substrate, and a deposition layer is formed. The deposition layer serves as a display region of the organic electroluminescent display device.

When the deposition material is deposited on the substrate, a part of the deposition material can be attached to wall surfaces of the through-holes of the deposition mask and a surface of the deposition mask that faces a deposition source. Consequently, attachment of the deposition material to the substrate is impeded by the wall surfaces of the through-holes and the surface of the deposition mask that faces the deposition source. This phenomenon is also called shadow. The thickness of the deposition mask tends to be decreased to reduce the occurrence of the shadow. Consequently, the mechanical strength of the deposition mask can decrease.

Patent Document 1: JP 2019-060028 A
Patent Document 2: JP 2005-183153 A

DISCLOSURE

According to an embodiment of the present disclosure, a deposition mask that enables the mechanical strength to be increased, a deposition mask apparatus, a deposition apparatus, and a manufacturing method for an organic device are provided.

A deposition mask according to an embodiment of the present disclosure includes a first surface, a second surface that is located opposite the first surface, and two or more through-holes that extend from the first surface to the second surface. Each of the through-holes includes a first recess that is located at the first surface, a second recess that is located at the second surface and that is in communication with the first recess, and a ridge line that is connected to a wall surface of the first recess and a wall surface of the second recess and that extends inward from the wall surface of the first recess and the wall surface of the second recess in the through-hole. The ridge line is closer to the first surface than the second surface. The deposition mask has a first mask region having a first surface remaining ratio that represents a remaining area ratio of the second surface and a second mask region having a second surface remaining ratio that represents a remaining area ratio of the second surface and that is higher than the first surface remaining ratio.

A deposition mask apparatus according to an embodiment of the present disclosure includes a frame that has a frame opening, and the deposition mask that is fixed to the frame and that includes the through-holes that overlap the frame opening in a plan view.

A deposition apparatus according to an embodiment of the present disclosure includes a deposition source that vaporizes a deposition material, and the deposition mask apparatus that faces the deposition source.

A manufacturing method for an organic device according to an embodiment of the present disclosure includes bringing the deposition mask of the deposition mask apparatus into close contact with a substrate, and forming a deposition layer by depositing a deposition material on the substrate in a manner in which the deposition material passes through the frame opening and the through-holes of the deposition mask.

According to an embodiment of the present disclosure, the mechanical strength can be improved.

DETAILED DESCRIPTION

Figure 1:
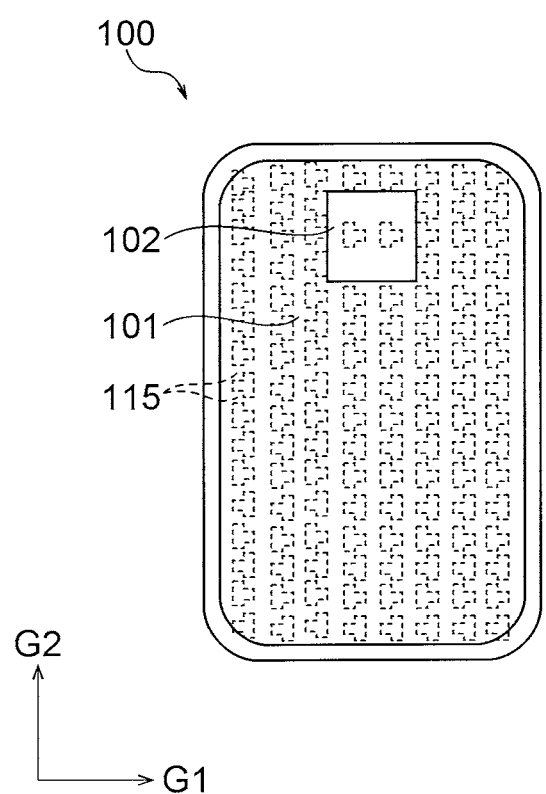
FIG. 1 is a plan view of an example of an organic device according to an embodiment of the present disclosure.

In the present specification and the drawings, words that mean substances on which components such as a "substrate", a "base material", a "plate", a "sheet", and a "film" are based are not distinguished from each other only based on different names unless there is a particular description.

In the present specification and the drawings, words such as "parallel" and "perpendicular" and the values of a length and an angle that specify shapes, geometrical conditions, and the degree of these, for example, are not limited by strict meaning but are interpreted to an extent that the same function can be expected unless there is a particular description.

In some cases where a component such as a member or a region is "on" or "under", "on an upper side of" or "on a lower side of", or "above" or "below" another component such as another member or another region in the present specification and the drawings, the cases include a case where the component is in direct contact with the other component unless there is a particular description. The cases also include a case where another component is between the component and the other component, that is, a case where the component and the other component are indirectly connected to each other. As for the words "on", "upper side", and "above", or "under", "lower side", and "below", an up-down direction may be reversed unless there is a particular description.

In the present specification and the drawings, like portions or portions that have the same function are designated by like reference characters or similar reference characters unless there is a particular description, and a duplicated description for these is omitted in some cases. For convenience of description, the ratio of dimensions in the drawings differs from an actual ratio, and an illustration of a part of a component is omitted in the drawings in some cases.

In the present specification and the drawings, a combination with another embodiment or a modification may be used without contradiction unless there is a particular description. Other embodiments may be combined with each other, and another embodiment and a modification may be combined with each other without contradiction. Modifications may be combined with each other without contradiction.

In the case where multiple processes related to a method such as a manufacturing method are disclosed in the present specification and the drawings, another process that is not disclosed may be performed between the disclosed processes unless there is a particular description. The order of the disclosed processes is freely selected without contradiction.

In the present specification and the drawings, a numerical range that is represented by the character "to" includes numerals placed in front of and behind the character "to" unless there is a particular description. For example, the numerical range that is defined by the expression "34 to 38 mass %" is the same as the numerical range that is defined by the expression "34 mass % or more and 38 mass % or less".

According to an embodiment of the present specification, an example of a deposition mask that is used for patterning an organic material on a substrate in a desired pattern when an organic device is manufactured and a manufacturing method for the deposition mask will be described. The present embodiment is not limited to such use but can be used for deposition masks that are used in various ways. For example, a deposition mask according to the present embodiment may be used to manufacture a device that displays or projects an image or a picture for creating virtual reality, that is, VR or augmented reality, that is, AR.

According to a first aspect of the present disclosure, a deposition mask includes a first surface, a second surface that is located opposite the first surface, and two or more through-holes that extend from the first surface to the second surface. Each of the through-holes includes a first recess that is located at the first surface, a second recess that is located at the second surface and that is in communication with the first recess, and a ridge line that is connected to a wall surface of the first recess and a wall surface of the second recess and that extends inward from the wall surface of the first recess and the wall surface of the second recess in the through-hole. The ridge line is closer to the first surface than the second surface. The deposition mask has a first mask region having a first surface remaining ratio that represents a remaining area ratio of the second surface and a second mask region having a second surface remaining ratio that represents a remaining area ratio of the second surface and that is higher than the first surface remaining ratio.

According to a second aspect of the present disclosure, in the deposition mask according to the first aspect described above, the first mask region may have a first aperture ratio that represents an area ratio of the through-holes, and the second mask region may have a second aperture ratio that represents an area ratio of the through-holes and that is lower than the first aperture ratio.

According to a third aspect of the present disclosure, in the deposition mask according to the first aspect described above or the second aspect described above, a sash bar that has a connection surface that connects the wall surfaces may be located between the wall surfaces of the second recesses adjacent to each other, the second recess may be surrounded by the connection surface in a plan view, the connection surface that surrounds the second recess in a plan view may have a highest point closest to the second surface, and an angle that is formed between an inclination definition line and the first surface may be 25° or more and 45° or less with a definition section passing through the highest point, where the definition section is a section that passes through a freely selected point on the connection surface, that is perpendicular to the first surface, and that passes through a point on the ridge line such that a distance from the freely selected point is shortest in a plan view, and the inclination definition line is a straight line that is in contact with the connection surface and the ridge line in the definition section.

According to a fourth aspect of the present disclosure, in the deposition mask according to the third aspect described above, the connection surface that surrounds the second recess may have two or more of the highest points, two or more of the definition sections that pass through the respective highest point of the two or more of the highest points may be defined, and an angle that is formed between the first surface and the inclination definition line in at least one definition section of the two or more of the definition sections may be 25° or more and 45° or less.

According to a fifth aspect of the present disclosure, in the deposition mask according to the third aspect described above or the fourth aspect described above, the highest point may be flush with the second surface in a direction perpendicular to the first surface.

According to a sixth aspect of the present disclosure, in the deposition mask according to the fifth aspect described above, the connection surface may include a top surface that is included in the second surface that remains, and the highest point may be a point on the top surface closest to the ridge line in a plan view.

According to a seventh aspect of the present disclosure, in the deposition mask according to any one of the third aspect described above to the sixth aspect described above, an angle that is formed between the first surface and the inclination definition line in the definition section that passes through the freely selected point on the connection surface may be 25° or more and 45° or less.

According to an eighth aspect of the present disclosure, in the deposition mask according to any one of the first aspect described above to the seventh aspect described above, the two or more through-holes may be arranged in a first direction in a plan view, and an array pitch of the through-holes that are located in the first mask region and that are adjacent to each other in the first direction may be 20 μm or more and 170 μm or less.

According to a ninth aspect of the present disclosure, in the deposition mask according to the eighth aspect described above, the two or more through-holes may be arranged in a second direction perpendicular to the first direction in a plan view, and the array pitch of the through-holes that are located in the first mask region and that are adjacent to each other in the second direction may be 20 μm or more and 170 μm or less.

According to a tenth aspect of the present disclosure, in the deposition mask according to any one of the first aspect described above to the ninth aspect described above, a thickness of the deposition mask may be 5 μm or more and 35 μm or less.

According to an eleventh aspect of the present disclosure, a deposition mask apparatus includes a frame that has a frame opening, and the deposition mask according to any one of the first aspect described above to the tenth aspect described above that is fixed to the frame and that includes the through-holes that overlap the frame opening in a plan view.

According to a twelfth aspect of the present disclosure, a deposition apparatus includes a deposition source that vaporizes a deposition material, and the deposition mask apparatus according to the eleventh aspect described above that faces the deposition source.

According to a thirteenth aspect of the present disclosure, the deposition apparatus according to the twelfth aspect described above may include a rotation drive mechanism that rotates the deposition mask with respect to the deposition source.

According to a fourteenth aspect of the present disclosure, a manufacturing method for an organic device includes bringing the deposition mask of the deposition mask apparatus according to the eleventh aspect described above into close contact with a substrate, and forming a deposition layer by depositing a deposition material on the substrate in a manner in which the deposition material passes through the frame opening and the through-holes of the deposition mask.

According to a fifteenth aspect of the present disclosure, in the method according to the fourteenth aspect described above, forming the deposition layer may include rotating the deposition mask apparatus and the substrate with respect to a deposition source that vaporizes the deposition material.

An embodiment of the present disclosure will now be described in detail with reference to the drawings. The embodiment described below is an example of an embodiment of the present disclosure, and the present disclosure is not limited to only the embodiment.

An organic device 100 according to the present embodiment will be described. The organic device 100 includes multiple elements 115. For example, the elements 115 may be pixels that are formed on a substrate 110 described later. The organic device 100 may be an organic electroluminescent display device. FIG. 1 is a plan view of an example of the organic device 100 viewed in the normal direction of the substrate 110 of the organic device 100. In the following description, viewing a surface of a substance on which the substrate, for example, is based in the normal direction is also referred to as "in a plan view".

As illustrated in FIG. 1, the organic device 100 may have a first display region 101 and a second display region 102 in a plan view. The second display region 102 may have an area smaller than that of the first display region 101. As illustrated in FIG. 1, the second display region 102 may be surrounded by the first display region 101. A part of an outer edge of the second display region 102 may be located on the same straight line as a part of an outer edge of the first display region 101 although this is not illustrated.

Figure 2:
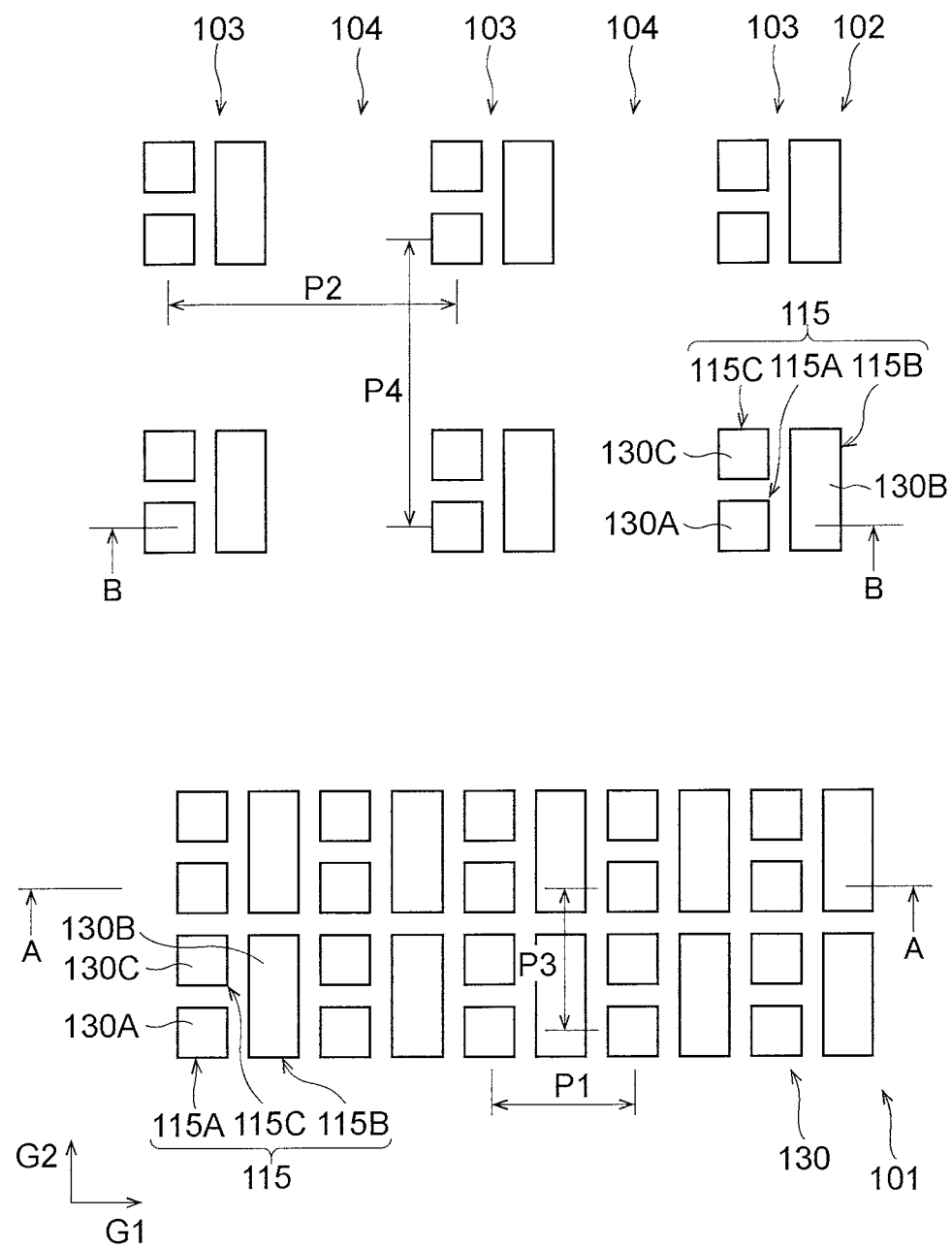
FIG. 2 is an enlarged plan view of examples of elements of an organic device that is manufactured by using a deposition mask apparatus according to an embodiment of the present disclosure.

FIG. 2 is an enlarged plan view of the elements 115 in the first display region 101 and the elements 115 in the second display region 102. In FIG. 2, an illustration of second electrodes 140 described later is omitted. The second electrodes 140, not illustrated, may overlap organic layers 130 that are included in the elements 115 in a plan view in both of the first display region 101 and the second display region 102.

In the first display region 101, the elements 115 may be arranged in two different directions. Two or more elements 115 in the first display region 101 may be arranged in a first element direction G1. Two or more elements 115 in the first display region 101 may be arranged in a second element direction G2 that intersects the first element direction G1. The second element direction G2 may be perpendicular to the first element direction G1. The elements 115 may include first elements 115A, second elements 115B, and third elements 115C as described later. FIG. 2 illustrates an example of an array of the elements 115A, 115B, and 115C. However, the present disclosure is not limited thereto. The array of the elements 115A, 115B, and 115C is freely selected.

In the first display region 101, as illustrated in FIG. 2, the organic layers 130 may be arranged at a first pitch P1 in the first element direction G1. In the second display region 102, the organic layers 130 may be arranged at a second pitch P2 in the first element direction G1. The second pitch P2 may be larger than the first pitch P1. Consequently, the area of a transparent region 104 increases. For this reason, the transmittance of the second display region 102 increases.

For example, the ratio of the second pitch P2 to the first pitch P1 may be 1.1 or more, may be 1.3 or more, or may be 1.5 or more. For example, the ratio of the second pitch P2 to the first pitch P1 may be 2.0 or less, may be 3.0 or less, or may be 4.0 or less. The range of the ratio of the second pitch P2 to the first pitch P1 may be determined by using a first group consisting of 1.1, 1.3, and 1.5 and/or a second group consisting of 2.0, 3.0, and 4.0. The range of the ratio of the second pitch P2 to the first pitch P1 may be determined by using a combination of a value freely selected from the values in the first group described above and a value freely selected from the values in the second group described above. The range of the ratio of the second pitch P2 to the first pitch P1 may be determined by using a combination of two values freely selected from the values in the first group described above. The range of the ratio of the second pitch P2 to the first pitch P1 may be determined by using a combination of two values freely selected from the values in the second group described above. For example, the range may be 1.1 or more and 4.0 or less, may be 1.1 or more and 3.0 or less, may be 1.1 or more and 2.0 or less, may be 1.1 or more and 1.5 or less, may be 1.1 or more and 1.3 or less, may be 1.3 or more and 4.0 or less, may be 1.3 or more and 3.0 or less, may be 1.3 or more and 2.0 or less, may be 1.3 or more and 1.5 or less, may be 1.5 or more and 4.0 or less, may be 1.5 or more and 3.0 or less, may be 1.5 or more and 2.0 or less, may be 2.0 or more and 4.0 or less, may be 2.0 or more and 3.0 or less, or may be 3.0 or more and 4.0 or less. In the case where the ratio of the second pitch P2 to the first pitch P1 is small, a difference between the pixel density of the first display region 101 and the pixel density of the second display region 102 is small. This inhibits a visual difference between the first display region 101 and the second display region 102 from being made.

In the first display region 101, as illustrated in FIG. 2, the organic layers 130 may be arranged at a third pitch P3 in the second element direction G2. In the second display region 102, the organic layers 130 may be arranged at a fourth pitch P4 in the second element direction G2. The fourth pitch P4 may be larger than the third pitch P3.

For example, the ratio of the fourth pitch P4 to the third pitch P3 may be 1.1 or more, may be 1.3 or more, or may be 1.5 or more. For example, the ratio of the fourth pitch P4 to the third pitch P3 may be 2.0 or less, may be 3.0 or less, or may be 4.0 or less. The range of the ratio of the fourth pitch P4 to the third pitch P3 may be determined by using the first group consisting of 1.1, 1.3, and 1.5 and/or the second group consisting of 2.0, 3.0, and 4.0. The range of the ratio of the fourth pitch P4 to the third pitch P3 may be determined by using a combination of a value freely selected from the values in the first group described above and a value freely selected from the values in the second group described above. The range of the ratio of the fourth pitch P4 to the third pitch P3 may be determined by using a combination of two values freely selected from the values in the first group described above. The range of the ratio of the fourth pitch P4 to the third pitch P3 may be determined by using a combination of two values freely selected from the values in the second group described above. For example, the range may be 1.1 or more and 4.0 or less, may be 1.1 or more and 3.0 or less, may be 1.1 or more and 2.0 or less, may be 1.1 or more and 1.5 or less, may be 1.1 or more and 1.3 or less, may be 1.3 or more and 4.0 or less, may be 1.3 or more and 3.0 or less, may be 1.3 or more and 2.0 or less, may be 1.3 or more and 1.5 or less, may be 1.5 or more and 4.0 or less, may be 1.5 or more and 3.0 or less, may be 1.5 or more and 2.0 or less, may be 2.0 or more and 4.0 or less, may be 2.0 or more and 3.0 or less, or may be 3.0 or more and 4.0 or less. In the case where the ratio of the fourth pitch P4 to the third pitch P3 is small, the difference between the pixel density of the first display region 101 and the pixel density of the second display region 102 is small. This inhibits the visual difference between the first display region 101 and the second display region 102 from being made.

As illustrated in FIG. 2, the second display region 102 may include non-transparent regions 103 and the transparent region 104. The non-transparent regions 103 may overlap the elements 115 in a plan view and may extend in the second element direction G2. In the non-transparent regions 103, the elements 115 may be arranged in the second element direction G2. The transparent region 104 may be a region in which the elements 115 are not present in a plan view and may extend in the second element direction G2. The non-transparent regions 103 and the transparent region 104 may be arranged in turn in the first element direction G1.

The transmittance of the non-transparent regions 103 is also referred to as a first transmittance. The transmittance of the transparent region 104 is also referred to as a second transmittance. The transparent region 104 does not contain the elements 115, and accordingly, the second transmittance is higher than the first transmittance. For this reason, in the second display region 102 including the transparent region 104, light that reaches the organic device 100 passes through the transparent region 104 and can reach, for example, an optical component at the back of the substrate 110. An example of the optical component is a component that detects light to perform a function such as a camera. The second display region 102 contains the non-transparent regions 103, and accordingly, a picture can be displayed in the second display region 102 in the case where the elements 115 are pixels. The second display region 102 can thus detect light and display a picture. Examples of the function of the second display region 102 that is performed by detecting light include those of a camera and a sensor such as a fingerprint sensor or a face recognition sensor. The amount of light that is received by the sensor can be increased by increasing the second transmittance of the transparent region 104.

In the case where any one of the dimensions of the non-transparent regions 103 in the first element direction G1 and in the second element direction G2 and the dimensions of the transparent region 104 in the first element direction G1 and in the second element direction G2 is 1 mm or less, the first transmittance and the second transmittance are measured by using a microspectrophotometer. OSP-SP200 manufactured by Olympus Corporation is used as the microspectrophotometer. The result of measurement at 550 nm with quartz used as reference is used as the first transmittance and the second transmittance.

In the case where any one of the dimensions of the non-transparent regions 103 in the first element direction G1 and in the second element direction G2 and the dimensions of the transparent region 104 in the first element direction G1 and in the second element direction G2 is more than 1 mm, the first transmittance and the second transmittance are measured by using a spectrophotometer. Ultraviolet visible light spectrophotometer UV-2600i manufactured by SHIMADZU CORPORATION is used as the spectrophotometer. A fine luminous flux diaphragm unit is mounted on the spectrophotometer. This enables the transmittance of a region that has a dimension of 1 mm at the maximum to be measured. The atmosphere is used as reference. The result of measurement at 550 nm is used as the first transmittance and the second transmittance.

For example, a ratio TR2/TR1 of a second transmittance TR2 to a first transmittance TR1 may be 1.2 or more, may be 1.5 or more, or may be 1.8 or more. For example, the TR2/TR1 may be 2 or less, may be 3 or less, or may be 4 or less. The range of the TR2/TR1 may be determined by using a first group consisting of 1.2, 1.5, and 1.8 and/or a second group consisting of 2, 3, and 4. The range of the TR2/TR1 may be determined by using a combination of a value freely selected from the values in the first group described above and a value freely selected from the values in the second group described above. The range of the TR2/TR1 may be determined by using a combination of two values freely selected from the values in the first group described above. The range of the TR2/TR1 may be determined by using a combination of two values freely selected from the values in the second group described above. For example, the range may be 1.2 or more and 4 or less, may be 1.2 or more and 3 or less, may be 1.2 or more and 2 or less, may be 1.2 or more and 1.8 or less, may be 1.2 or more and 1.5 or less, may be 1.5 or more and 4 or less, may be 1.5 or more and 3 or less, may be 1.5 or more and 2 or less, may be 1.5 or more and 1.8 or less, may be 1.8 or more and 4 or less, may be 1.8 or more and 3 or less, may be 1.8 or more and 2 or less, may be 2 or more and 4 or less, may be 2 or more and 3 or less, or may be 3 or more and 4 or less.

Figure 3:
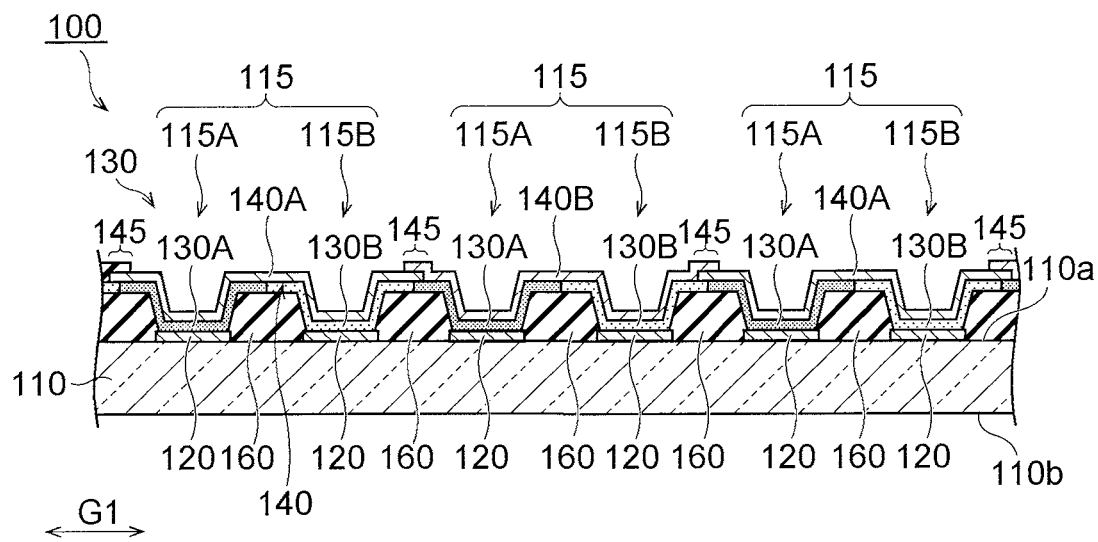
FIG. 3 is a sectional view of the organic device illustrated in FIG. 2 taken along line A-AI.
Figure 4:
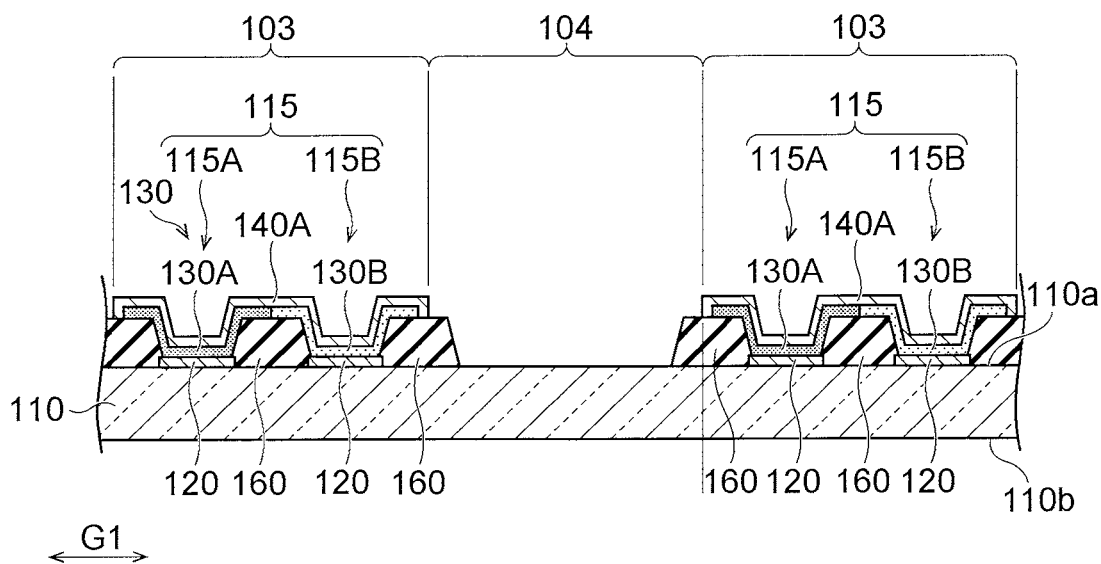
FIG. 4 is a sectional view of the organic device illustrated in FIG. 2 taken along line B-B.

The organic device 100 will be described in more detail. FIG. 3 is a sectional view of the organic device 100 illustrated in FIG. 2 taken along line A-A. FIG. 4 is a sectional view of the organic device 100 illustrated in FIG. 2 taken along line B-B. The organic device 100 includes the organic layers 130 that are formed on the substrate 110 by using a deposition mask apparatus 10 according to the present embodiment described later. The single organic device 100 may include a single display region.

As illustrated in FIG. 3, the organic device 100 includes the substrate 110 and the elements 115 that are located on the substrate 110. The elements 115 may include first electrodes 120, the organic layers 130 that are located on the first electrodes 120, and the second electrodes 140 that are located on the organic layers 130.

The organic device 100 may include an insulating layer 160 that is located between two first electrodes 120 adjacent to each other in a plan view. The insulating layer 160 may contain, for example, polyimide. The insulating layer 160 may overlap end portions of the first electrodes 120.

The organic device 100 may be an active-matrix device. For example, the organic device 100 may include switches that are electrically connected to the respective multiple elements 115 although this is not illustrated. Examples of the switches may include transistors. The switches may control on-off of a voltage or current to the respective elements 115.

The substrate 110 may include a first surface 110a on which the elements 115 are located and a second surface 110b that is located opposite the first surface 110a. The substrate 110 may be an insulating plate member. The substrate 110 may have optical transparency and allow visible light to pass therethrough. For example, the substrate 110 may be a glass substrate.

In the case where the substrate 110 has predetermined optical transparency, the optical transparency of the substrate 110 may be such that light from the organic layers 130 can pass therethrough and can be displayed. For example, the transmittance of the substrate 110 in a visible-light region may be 70% or more, may be 80% or more, or may be 90% or more. The transmittance of the substrate 110 may be measured by using a test method for Plastics-Determination of the total luminous transmittance of transparent materials based on JIS K7361-1.

The substrate 110 may be flexible or may not be flexible. The material of the substrate 110 may be selected depending on the use of the organic device 100.

The thickness of the substrate 110 may be appropriately selected depending on, for example, the material used for the substrate 110 or the use of the organic device 100. For example, the thickness of the substrate 110 may be 0.005 mm or more. The thickness of the substrate 110 may be 5 mm or less.

The elements 115 may be configured to perform a function in a manner in which a voltage is applied between the first electrodes 120 and the second electrodes 140. Alternatively, the elements 115 may be configured to perform a function in a manner in which a current flows between the first electrodes 120 and the second electrodes 140. For example, in the case where the elements 115 are pixels of the organic device 100, the elements 115 may emit light for forming a picture.

The first electrodes 120 contain a conductive material. For example, the first electrodes 120 may contain metal, a conductive metal oxide or another conductive inorganic material. The first electrodes 120 may contain a conductive metal oxide that has optical transparency such as an indium tin oxide. The material of the first electrodes 120 may be an indium tin oxide abbreviated as ITO or an indium zinc oxide abbreviated as IZO.

The organic layers 130 contain an organic material. When the organic layers 130 are energized, the organic layers 130 can perform a function. The phrase "to be energized" means that a voltage is applied to the organic layers 130, or a current flows through the organic layers 130. Examples of the organic layers 130 may include light-emitting layers that emit light when being energized and layers the refractive index or the optical transmittance of which changes when being energized. The organic layers 130 may contain an organic semiconductor material.

As illustrated in FIG. 2 and FIG. 3, the organic layers 130 may include first organic layers 130A, second organic layers 130B, and third organic layers 130C. The organic layers 130A, 130B, and 130C may be formed by using a deposition method in which a deposition mask 20 according to the present embodiment is used. For example, the first organic layers 130A may be red light-emitting layers. For example, the second organic layers 130B may be blue light-emitting layers. For example, the third organic layers 130C may be green light-emitting layers. For example, the through-holes 25 of the deposition mask 20 that are used to form the first organic layers 130A may be formed so as to be suitable for the pattern of the first organic layers 130A. The through-holes 25 of the deposition mask 20 that are used to form the second organic layers 130B may be formed so as to be suitable for the pattern of the second organic layers 130B. The through-holes 25 of the deposition mask 20 that are used to form the third organic layers 130C may be formed so as to be suitable for the pattern of the third organic layers 130C. In the following description, the words and reference characters of the "organic layers 130" are used in the case of description of a structure that is common to the first organic layers 130A, the second organic layers 130B, and the third organic layers 130C among structures in the organic layers.

The first elements 115A described above may include the first electrodes 120, the first organic layers 130A, and the second electrodes 140. The second elements 115B may include the first electrodes 120, the second organic layers 130B, and the second electrodes 140. The third elements 115C may include the first electrodes 120, the third organic layers 130C, and the second electrodes 140. The first elements 115A, the second elements 115B, and the third elements 115C are sub-pixels. A single pixel may correspond to a combination of the first element 115A, the second element 115B, and the third element 115C.

In the following description, the words and reference characters of the "elements 115" are used in the case of description of a structure that is common to the first elements 115A, the second elements 115B, and the third elements 115C among structures in the elements. In a plan view such as FIG. 2, the contours of the elements 115 may be the same as the contours of the organic layers 130 that overlap the first electrodes 120 and the second electrodes 140 in a plan view. In the case where the organic device 100 includes the insulating layers 160, the contours of the elements 115 may be the same as the contours of the organic layers 130 that overlap the first electrodes 120 and the second electrodes 140 and that do not overlap the insulating layers 160 in a plan view.

When a voltage is applied between the first electrodes 120 and the second electrodes 140, the organic layers 130 that are located therebetween are driven. In the case where the organic layers 130 are light-emitting layers, light is emitted from the organic layers 130, and the light exits from the second electrodes 140 to the outside or the first electrodes 120 to the outside.

In the case where the organic layers 130 are light-emitting layers that emit light when being energized, the organic layers 130 may include a hole injection layer, a hole transport layer, an electron transport layer, an electron injection layer, or another layer.

For example, in the case where the first electrodes 120 are anodes, the organic layers 130 may include hole injection transport layers between light-emitting layers and the first electrodes 120. The hole injection transport layers may be hole injection layers that have a hole injection function. The hole injection transport layers may be hole transport layers that have a hole transport function or may have both of the hole injection function and the hole transport function. The hole injection transport layers may have a structure in which a hole injection layer and a hole transport layer are stacked.

In the case where the second electrodes 140 are cathodes, the organic layers 130 may include electron injection transport layers between light-emitting layers and the second electrodes 140. The electron injection transport layers may be electron injection layers that have an electron injection function. The electron injection transport layers may be electron transport layers that have an electron transport function or may have both of the electron injection function and the electron transport function. The electron injection transport layers may have a structure in which an electron injection layer and an electron transport layer are stacked.

In the case where the organic layers 130 are light-emitting layers, the organic layers 130 contain a light-emitting material. The light-emitting layers may contain an additive that improves leveling properties. A known material may be used as the light-emitting material. Examples of the light-emitting material include a pigment material, a metal complex material, or a polymeric material.

The thickness of each organic layer 130 is freely selected provided that the thickness enables an electron and a hole to be recombined and enables light to be emitted. The thickness of the organic layer 130 may be, for example, 1 nm or more. The thickness of the organic layer 130 may be, for example, 500 nm or less.

The second electrodes 140 contain a conductive material such as metal. The second electrodes 140 may be formed on the organic layers 130. Examples of the material of the second electrodes 140 may include platinum, gold, silver, copper, iron, tin, chromium, aluminum, indium, lithium, sodium, potassium, calcium, magnesium, chromium, or carbon. These conductive materials may be used alone, or two or more kinds of the materials may be combined and used. In the case where two or more kinds of the materials are used, layers composed of the respective materials may be stacked. An alloy containing two or more kinds of the materials may be used as the conductive material. For example, the conductive material may be a magnesium alloy such as MgAg, an aluminum alloy such as AlLi, AlCa, or AlMg, an alkali metal alloy, or an alkali earth metal alloy. The material of the second electrodes 140 may be an indium tin oxide abbreviated as ITO or an indium zinc oxide abbreviated as IZO.

As illustrated in FIG. 3 and FIG. 4, the second electrodes 140 may include first layers 140A and second layers 140B. The first layers 140A and the second layers 140B are patterned. The first layers 140A and the second layers 140B may be examples of a deposition layer. The first layers 140A and the second layers 140B may be formed by using a deposition method in which different deposition masks 20 are used. More specifically, the through-holes 25 of the deposition mask 20 that is used to form the first layers 140A may be formed so as to be suitable for the pattern of the first layers 140A. The through-holes 25 of the deposition mask 20 that is used to form the second layers 140B may be formed so as to be suitable for the pattern of the second layers 140B. The second electrodes 140 that include the patterned first layers 140A and the patterned second layers 140B enable the degree of freedom of design to be increased. For example, this readily avoids disposing the second electrodes 140 at a position at which the degree of the optical transparency is to be increased. For this reason, the degree of the optical transparency of the organic device 100 can be increased.

The first layers 140A and the second layers 140B may extend so as to overlap at least one of the organic layers 130 that include the first organic layers 130A, the second organic layers 130B, and the third organic layers 130C in a plan view. As illustrated in FIG. 3 and FIG. 4, end portions of the first layers 140A and end portions of the second layers 140B may partly overlap. Regions in which the first layers 140A and the second layers 140B overlap are also referred to as electrode overlapping regions 145. The first layers 140A and the second layers 140B can be electrically connected to each other with the first layers 140A and the second layers 140B overlapping.

The organic device 100 may include a sealing layer (not illustrated) that covers elements on the substrate 110 such as the organic layers 130. The sealing layer inhibits, for example, water vapor outside the organic device 100 from entering the organic device 100. This inhibits, for example, the organic layers 130 from being degraded due to moisture. The sealing layer may include a layer composed of, for example, an organic material. The organic material may have a refractive index equal to that of the organic layers 130 or may have a refractive index close to that of the organic layers 130 in order to inhibit light from being refracted by the sealing layer. For example, the organic material may be sealed by using an inorganic material such as silicon nitride (SiN). In this case, the sealing layer may have a multilayer structure in which a layer composed of the organic material and a layer composed of the inorganic material are stacked. A flattening layer (not illustrated) may be interposed between the second electrodes 140 and the sealing layer. The flattening layer may be used to improve the adhesion of the sealing layer by filling unevenness of the elements on the substrate 110.

The arrangement of the organic layers 130 in a plan view is detected by observing the organic device 100 by using a digital microscope having high magnification. An occupancy ratio, an area, a dimension, a gap can be calculated based on the result of detection. In the case where the organic device 100 includes a cover such as a glass cover, the organic layers 130 may be observed after the cover is removed. The cover is removed by being peeled.

The thickness of each component of the organic device 100 may be measured by observing an image of a section of the organic device 100 by using a white light interferometer. The thickness of the substrate 110, the thickness of each organic layer 130, and the thickness of each second electrode 140 are measured by using a white light interferometer "VertScan (registered trademark), R6500H-A300" manufactured by Mitsubishi Chemical Systems, Inc.

A method of forming the organic layers 130 and the second electrodes 140 of the organic device 100 described above by using a deposition method will be described.

Figure 5:
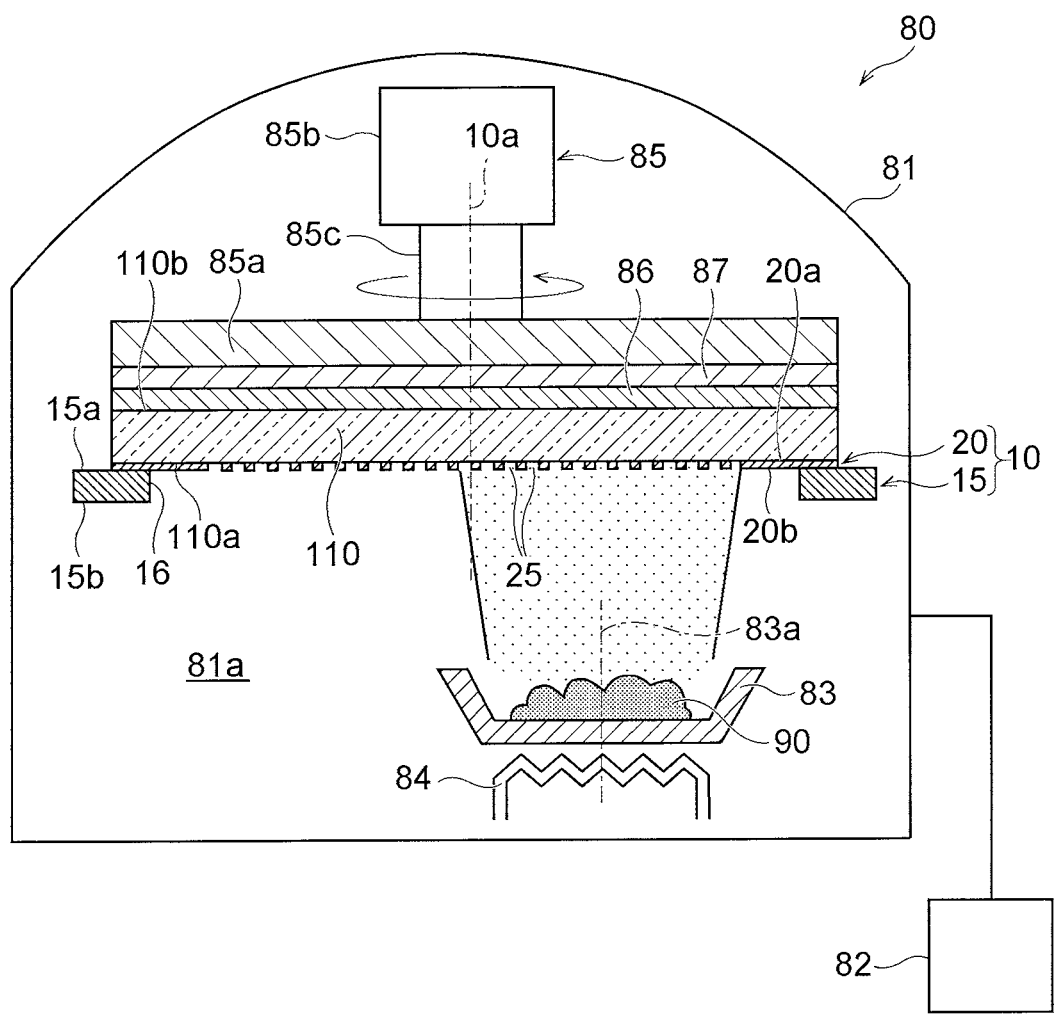
FIG. 5 illustrates an example of a deposition apparatus that includes a deposition mask apparatus according to an embodiment of the present disclosure.

A deposition apparatus 80 that performs a deposition process for depositing a deposition material on the substrate that is a subject will now be described with reference to FIG. 5. FIG. 5 illustrates the deposition apparatus 80. As illustrated in FIG. 5, the deposition apparatus 80 may include a casing 81, a discharge portion 82, a deposition source 83, a heater 84, a rotation drive mechanism 85, and the deposition mask apparatus 10. The deposition apparatus 80 illustrated in FIG. 5 is an example of a rotatable deposition apparatus.

The casing 81 may define a process space 81a for performing the deposition process. The discharge portion 82 may be connected to the casing 81. In this case, the discharge portion 82 discharges gas in the process space 81a, the pressure of the process space 81a consequently decreases, and a vacuum atmosphere is maintained in the process space 81a.

The deposition source 83 is located in the casing 81. The deposition source 83 is configured to let a deposition material 90 to vaporize, and an example thereof may be a crucible. An example of the deposition material 90 that is contained in the deposition source 83 is an organic light-emitting material or an inorganic material. The heater 84 is configured to heat the deposition material 90 that is contained in the deposition source 83. The deposition source 83 may be fixed to the casing 81 so as not to move in the process space 81a.

The rotation drive mechanism 85 may be mounted on the casing 81. The rotation drive mechanism 85 may be configured to rotate the substrate 110 and the deposition mask apparatus 10 with respect to the deposition source 83. In an example illustrated in FIG. 5, the rotation drive mechanism 85 is located above the deposition source 83. The rotation drive mechanism 85 may include a holder 85a that holds the substrate 110 and the deposition mask apparatus 10, a rotation drive portion 85b that rotates the holder 85a with respect to the casing 81, and a rotating shaft 85c that couples the holder 85a and the rotation drive portion 85b with each other. The holder 85a may hold the substrate 110 and the deposition mask apparatus 10 by using a magnet 87 described later.

The deposition mask apparatus 10 is located in the casing 81 and faces the deposition source 83. The deposition mask apparatus 10 may be held by the holder 85a described above during deposition. In the example illustrated in FIG. 5, the deposition mask apparatus 10 is located above the deposition source 83. According to the present embodiment, a region of the substrate 110 on which the deposition material 90 is to be deposited is wider than a region that the deposition material 90 that is vaporized by the deposition source 83 can reach. The central axis 83a of the deposition source 83 may be in misaligned with the central axis 10a of rotation of the deposition mask apparatus 10. The rotation drive portion 85b described above is driven during deposition, and consequently, the substrate 110 and the deposition mask apparatus 10 rotate about the central axis 10a. In this way, the deposition material 90 can reach the entire region of the substrate 110 in which the deposition material 90 is to be deposited.

As illustrated in FIG. 5, the deposition apparatus 80 may include a cooling plate 86. The cooling plate 86 is located on the second surface 110b of the substrate 110 opposite the deposition masks 20. The cooling plate 86 may contain a flow path through which refrigerant circulates. In the deposition process, the cooling plate 86 cools the substrate 110, and the temperature of the substrate 110 can be inhibited from increasing. The deposition mask apparatus 10 will be described in detail later.

The deposition apparatus 80 may include the magnet 87. The magnet 87 is located on a surface of the cooling plate 86 opposite the deposition masks 20. The magnet 87 is held by the holder 85a described above. The deposition mask apparatus 10 is attracted to the substrate 110 due to the magnetic force of the magnet 87, and the deposition mask apparatus 10 and the substrate 110 are held by the holder 85a. The deposition masks 20 are brought into close contact with the substrate 110. Consequently, the precision of the dimensions of the organic layers 130 that are formed on the substrate 110 and that will be described later and the precision of the positions thereof can be improved. The deposition masks 20 may be brought into close contact with the substrate 110 by using an electrostatic chuck that uses electrostatic force instead of the magnet 87.

Figure 6:
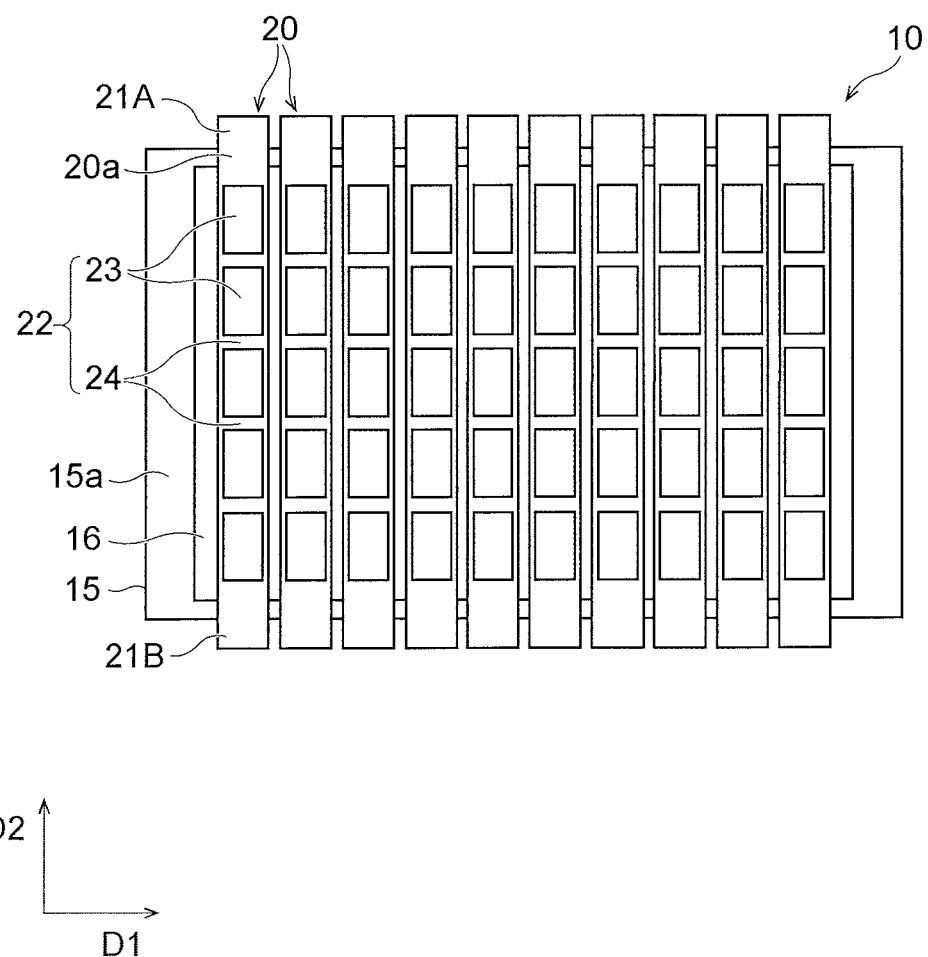
FIG. 6 is a plan view of the deposition mask apparatus illustrated in FIG. 5 viewed toward a first surface of deposition mask.

The deposition mask apparatus 10 will now be described with reference to FIG. 5 and FIG. 6. FIG. 6 is a plan view of the deposition mask apparatus. As illustrated in FIG. 5 and FIG. 6, the deposition mask apparatus 10 may include a frame 15 and the deposition masks 20. The deposition masks 20 may be fixed to the frame 15. The frame 15 supports the deposition masks 20 with the deposition masks 20 pulled in a second mask direction D2 so as to inhibit the deposition masks 20 from being bent.

The deposition mask apparatus 10 is disposed in the deposition apparatus 80 as described above. In this case, as illustrated in FIG. 5, the deposition masks 20 are in contact with the first surface 110a of the substrate 110 to which the deposition material 90 is to be attached. The deposition masks 20 include the multiple through-holes 25 that allow the deposition material that comes from the deposition source 83 to pass therethrough. In the following description, each deposition mask 20 may have a first surface 20a and a second surface 20b. The first surface 20a is located so as to face the substrate 110. The second surface 20b is located opposite the first surface 20a.

As illustrated in FIG. 6, the deposition mask apparatus 10 may include the multiple deposition masks 20 that are arranged in a first mask direction D1. FIG. 6 is a plan view of the deposition mask apparatus 10 viewed toward the first surface 20a of each deposition mask 20. According to the present embodiment, the deposition masks 20 have a rectangular shape extending in the second mask direction D2 perpendicular to the first mask direction D1. Both end portions of the deposition mask 20 in the second mask direction D2 may be fixed to the frame 15 by, for example, spot welding.

The frame 15 has a first surface 15a and a second surface 15b. The first surface 15a is located so as to face the deposition masks 20. The second surface 15b is located opposite the first surface 15a.

The frame 15 may have a frame opening 16. The frame 15 has a rectangular frame shape in a plan view. The frame opening 16 is formed inside the frame 15. The frame opening 16 extends from the first surface 15a to the second surface 15b through the frame 15. The phrase "in a plan view" means to view, for example, the deposition mask apparatus 10 or deposition mask 20 in the normal direction N of the first surface 15a of the frame 15 or the second surface 20b of the deposition mask 20.

Figure 7:
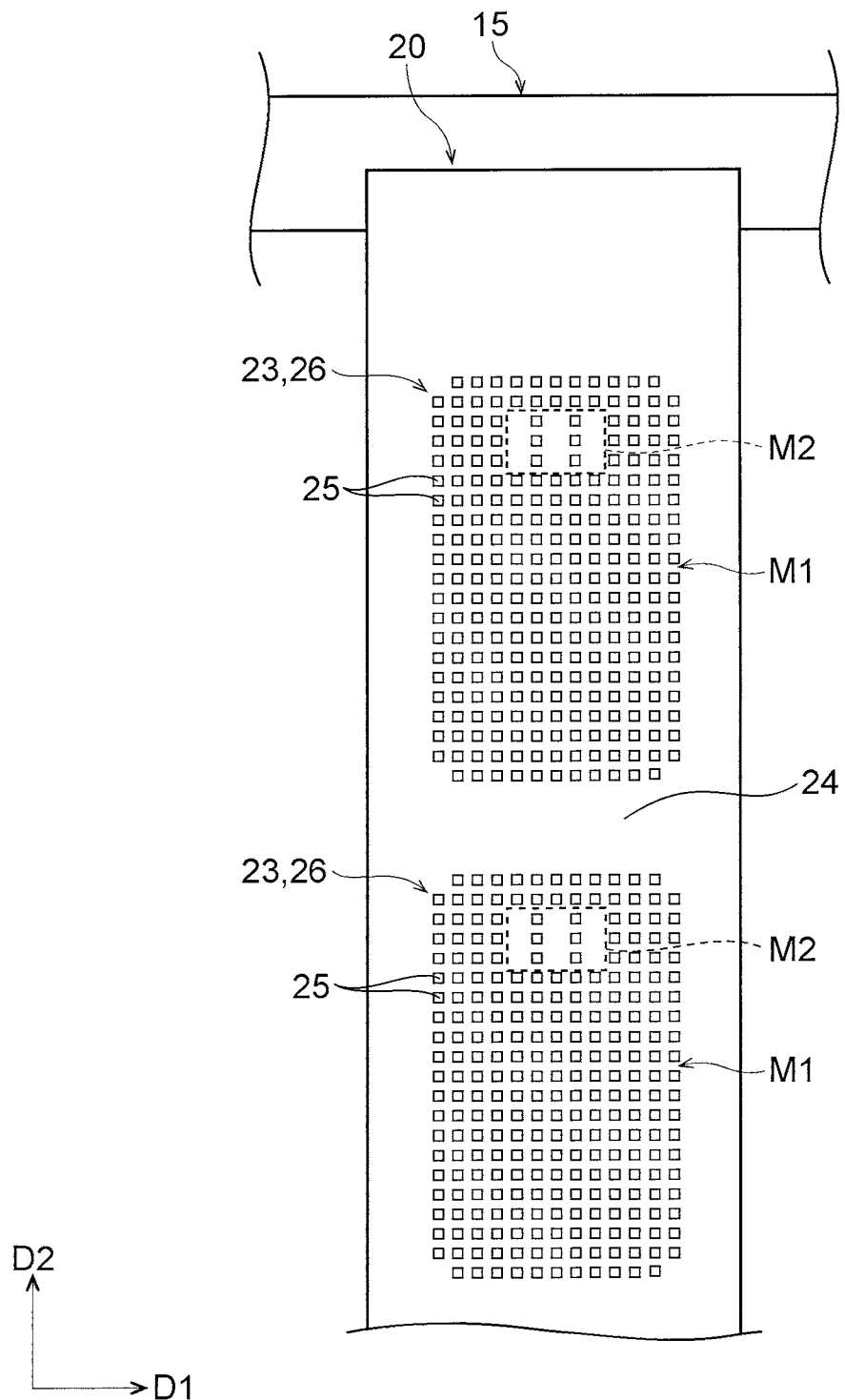
FIG. 7 is a plan view of one of the deposition masks of the deposition mask apparatus illustrated in FIG. 6.
Figure 8:
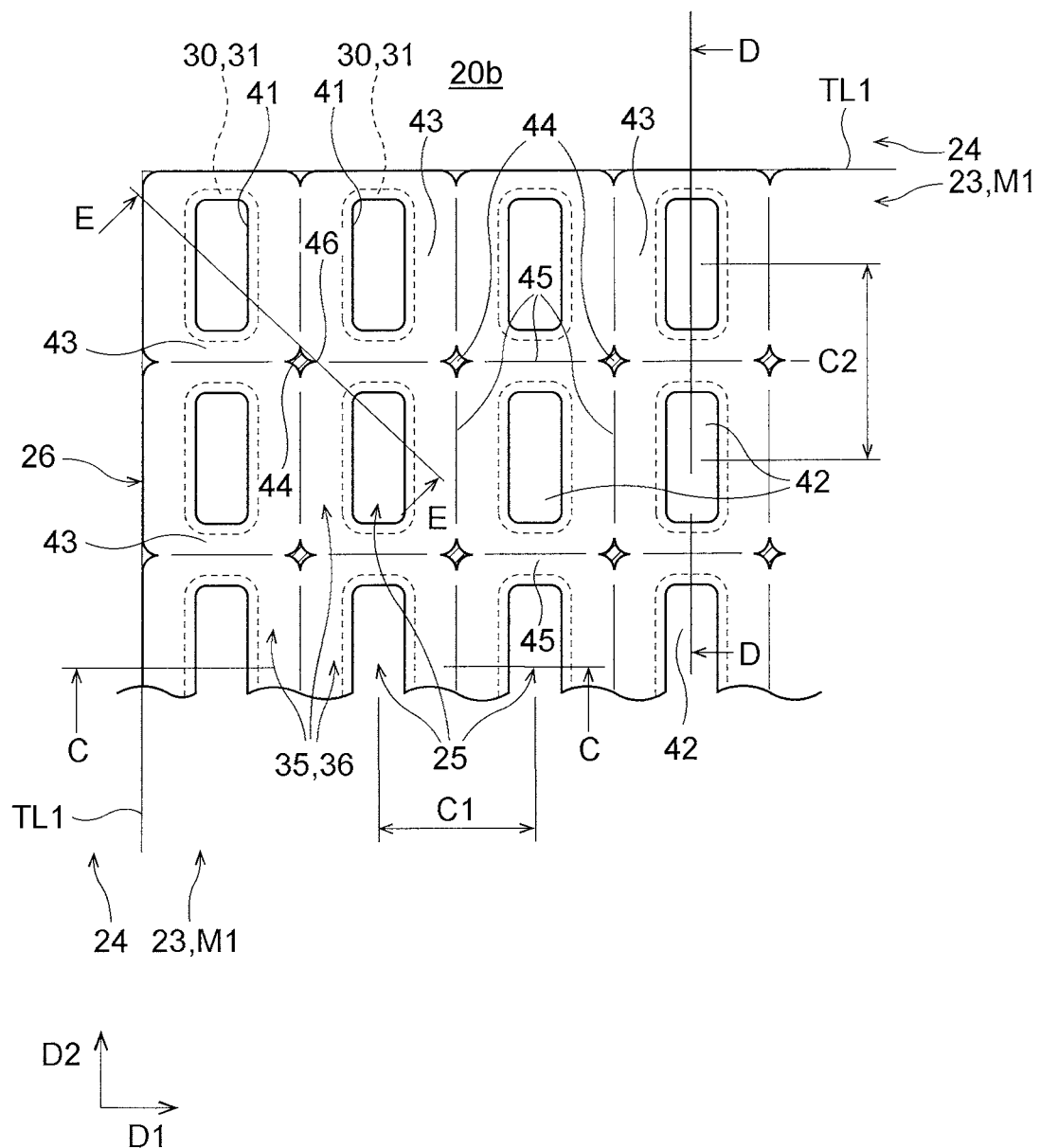
FIG. 8 is an enlarged partial plan view of a first mask region on a second surface of the deposition mask illustrated in FIG. 7.
Figure 9:
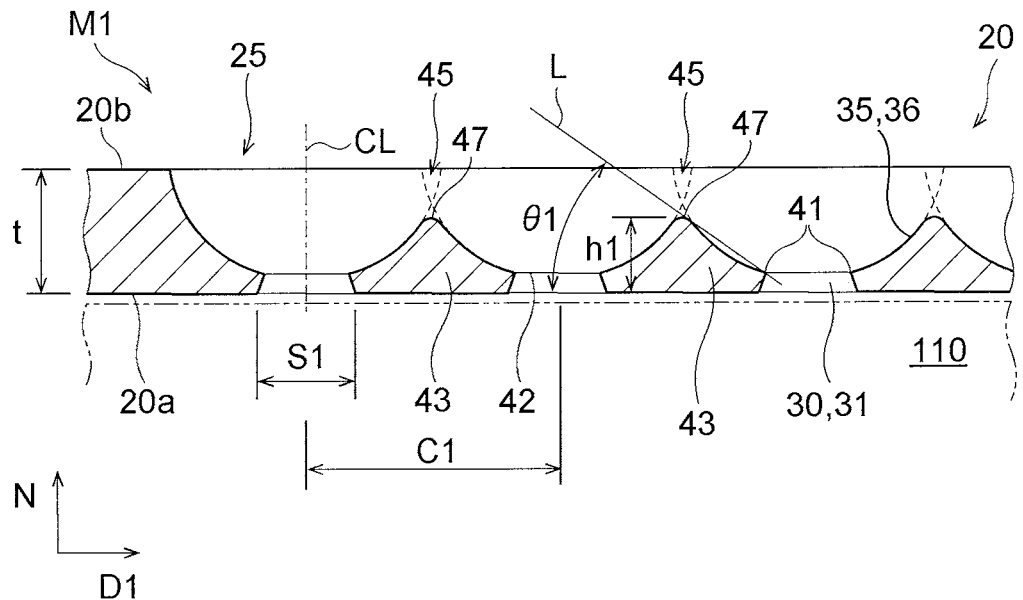
FIG. 9 is a sectional view taken along line C-C illustrated in FIG. 8.
Figure 10:
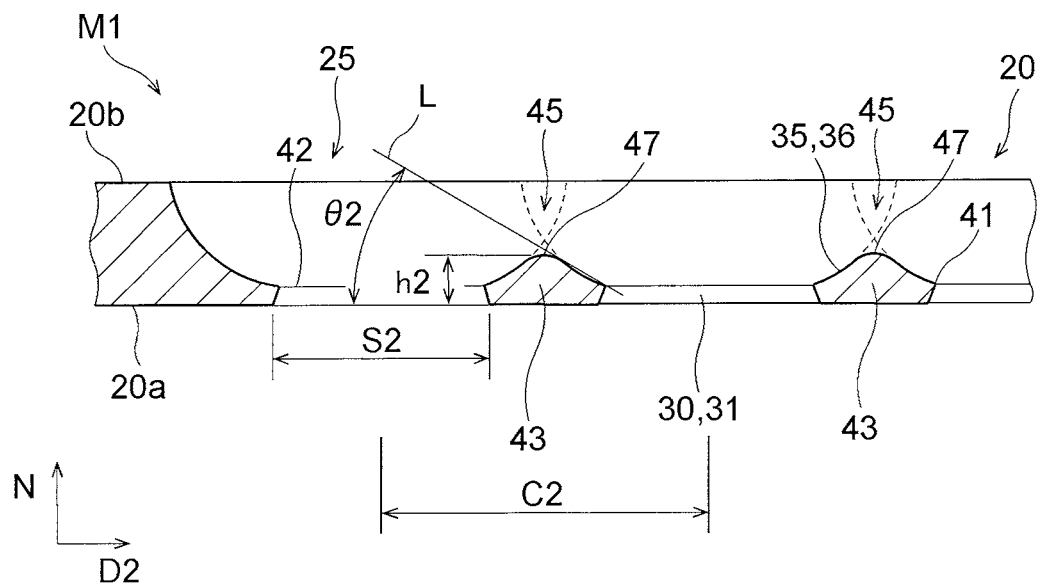
FIG. 10 is a sectional view taken along line D-D illustrated in FIG. 8.
Figure 11:
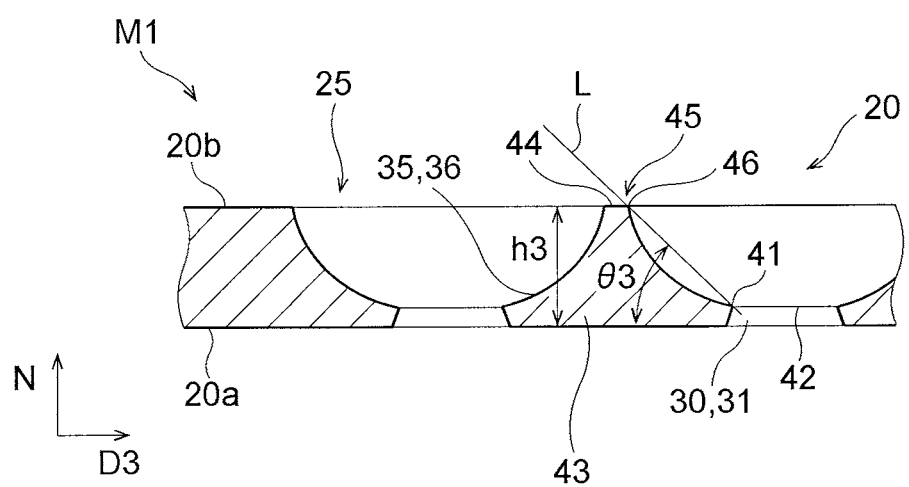
FIG. 11 is a sectional view taken along line E-E illustrated in FIG. 8.
Figure 12:
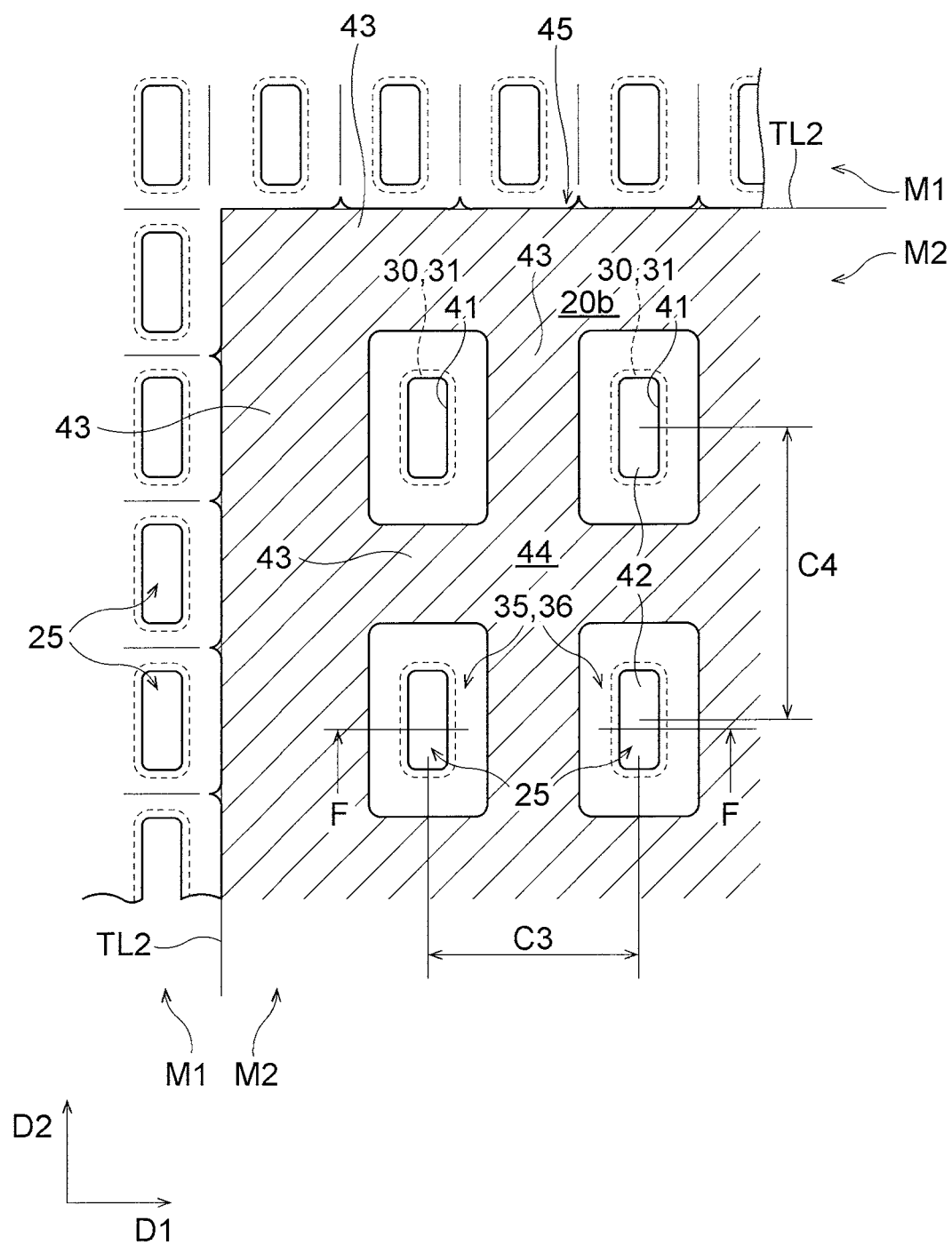
FIG. 12 is an enlarged partial plan view of a second mask region on the second surface of the deposition mask illustrated in FIG. 7.
Figure 13:
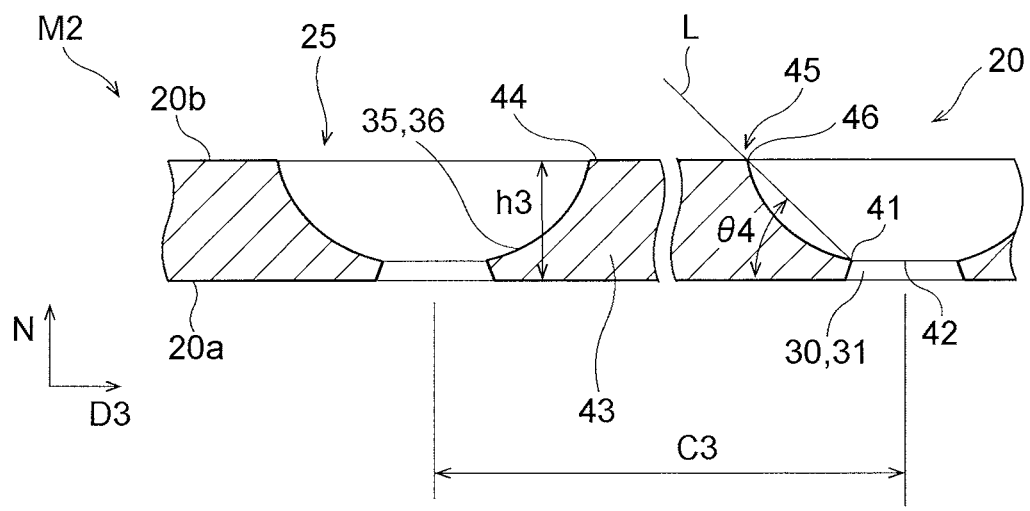
FIG. 13 is a sectional view taken along line F-F illustrated in FIG. 12.

The deposition masks 20 will now be described with reference to FIG. 6 to FIG. 15. FIG. 7 is a plan view of one of the deposition masks 20 of the deposition mask apparatus 10. FIG. 8 is an enlarged partial plan view of a first mask region M1 on the second surface 20b of the deposition mask 20. FIG. 9 is a sectional view taken along line C-C illustrated in FIG. 8. FIG. 10 is a sectional view taken along line D-D illustrated in FIG. 8. FIG. 11 is a sectional view taken along line E-E illustrated in FIG. 8. FIG. 12 is an enlarged partial plan view of a second mask regions M2 on the second surface 20b of the deposition mask 20. FIG. 13 is a sectional view taken along line F-F illustrated in FIG. 12.

As illustrated in FIG. 6, each deposition mask 20 may have a rectangular shape so as to have the longitudinal direction which is the second mask direction D2. The deposition mask 20 may include a pair of ears 21A and 21B and an intermediate portion 22. The pair of ears 21A and 21B may be fixed to the frame 15. The ear 21A may correspond to a first end of the deposition mask 20 in the second mask direction D2. The ear 21B may correspond to a second end of the deposition mask 20 in the second mask direction D2. The intermediate portion 22 is located between the pair of ears 21A and 21B.

The intermediate portion 22 of each deposition mask 20 may have at least an effective region 23 and a peripheral region 24. The peripheral region 24 is located around the effective region 23. In an example illustrated in FIG. 6, the intermediate portion 22 includes five effective regions 23. The peripheral region 24 surrounds the effective regions 23 in a plan view.

One of the effective regions 23 may correspond to a single display region of the organic device 100. Each deposition mask 20 illustrated in FIG. 6 includes the multiple effective regions 23 and enables multi-imposition deposition on the display region to be performed. More specifically, five organic devices 100 can be manufactured from one of the deposition masks 20 illustrated in FIG. 6.

Each effective region 23 may have a contour that has, for example, a substantially rectangular shape in a plan view. The effective region 23 illustrated in FIG. 6 has a contour that has a substantially rectangular shape so as to have the longitudinal direction which is the second mask direction D2. The effective region 23 may have a contour that has a different shape depending on the shape of the display region of the organic device 100 although this is not illustrated. For example, the effective region 23 may has a circular contour.

Each deposition mask 20 may have the first surface 20a and the second surface 20b and may include the multiple through-holes 25. The first surface 20a may be located opposite the frame 15. The first surface 20a may be located so as to face the substrate 110 during deposition. The second surface 20b may be located opposite the first surface 20a. The second surface 20b may be located so as to face the frame 15 during deposition.

The through-holes 25 extend from the first surface 20a to the second surface 20b through deposition mask 20. As for the form of the deposition mask apparatus 10, the through-holes 25 overlap the frame opening 16 in a plan view. The through-holes 25 may be located between the pair of ears 21A and 21B described above. The through-holes 25 may be located in the effective regions 23. The through-holes 25 may be arranged in the first mask direction D1 and in the second mask direction D2.

As illustrated in FIG. 7, through-hole groups 26 that include the multiple through-holes 25 may be located in the effective regions 23. One of the effective regions 23 may belong to one of the through-hole groups 26. The effective regions 23 may be occupied by the through-hole groups 26. The through-hole groups 26 may overlap the frame opening 16 of the frame 15 in a plan view. Each through-hole group 26 may be configured such that two or more through-holes 25 belong thereto. The words "through-hole groups 26" mean collections of the multiple through-holes 25 that are regularly arranged. Some of through-holes 25 that belong to one of the through-hole groups 26 and that are along an outer edge correspond to outermost through-holes 25 among the multiple through-holes 25 that are regularly arranged in the same manner. The through-holes 25 that are regularly arranged in the same manner and that are configured to allow the deposition material 90 to pass therethrough may not be present outside the through-holes 25 along the outer edge in one of the through-hole groups 26. An example of regular arrangement may be such that the through-holes 25 are arranged in parallel as described later. Each through-hole group 26 may have a contour that has a substantially rectangular shape in a plan view as in the effective regions 23.

As illustrated in FIG. 7, each deposition mask 20 has the first mask direction D1 and the second mask direction D2 that intersects the first mask direction D1. The first mask direction D1 may be perpendicular to the second mask direction D2. The first mask direction D1 may coincide with the first element direction G1. The second mask direction D2 may coincide with the second element direction G2.

As illustrated in FIG. 7, in the case where the deposition mask 20 is viewed in the normal direction of the first surface 20a, the effective regions 23 of the deposition mask 20 may include the first mask regions M1 and the second mask regions M2. The first mask region M1 corresponds to the first display region 101 of the organic device 100. The second mask region M2 corresponds to the second display region 102 of the organic device 100.

The first mask region M1 has a first aperture ratio that represents the area ratio of the through-holes 25. The first aperture ratio is calculated by dividing the total area of the through-holes 25 that are located in the first mask region M1 by the area of the first mask region M1. The second mask region M2 has a second aperture ratio that represents the area ratio of the through-holes 25. The second aperture ratio is calculated by dividing the total area of the through-holes 25 that are located in the second mask region M2 by the area of the second mask region M2. The second aperture ratio may be lower than the first aperture ratio.

The area of first mask region M1 is defined by using a tangent TL1 (see FIG. 8) that is in contact with the outsides of the outermost through-holes 25 in the through-hole group 26 or the effective regions 23 on the second surface 20b. The tangent TL1 is in contact with edges of second recesses 35 on the second surface 20b. The area of the first mask region M1 does not include the area of the second mask region M2. The area of the second mask region M2 is defined by using a tangent TL2 (see FIG. 12) that is in contact with the insides of the through-holes 25 that are in contact with the second mask region M2. The insides of the through-holes 25 mean insides when the second mask region M2 is viewed as the center. The tangent TL2 is a line that defines outer edges of the second mask region M2. The tangent TL2 is in contact with edges of the second recesses 35 on the second surface 20b.

The area of the through-holes 25 used to calculate the first aperture ratio and the second aperture ratio are the area of the through-holes 25 on the first surface 20a.

For example, the ratio of the second aperture ratio to the first aperture ratio may be 0.2 or more, may be 0.3 or more, or may be 0.4 or more. For example, the ratio of the second aperture ratio to the first aperture ratio may be 0.6 or less, may be 0.7 or less, or may be 0.8 or less. The range of the ratio of the second aperture ratio to the first aperture ratio may be determined by using a first group consisting of 0.2, 0.3, and 0.4 and/or a second group consisting of 0.6, 0.7, and 0.8. The range of the ratio of the second aperture ratio to the first aperture ratio may be determined by using a combination of a value freely selected from the values in the first group described above and a value freely selected from the values in the second group described above. The range of the ratio of the second aperture ratio to the first aperture ratio may be determined by using a combination of two values freely selected from the values in the first group described above. The range of the ratio of the second aperture ratio to the first aperture ratio may be determined by using a combination of two values freely selected from the values in the second group described above. For example, the range may be 0.2 or more and 0.8 or less, may be 0.2 or more and 0.7 or less, may be 0.2 or more and 0.6 or less, may be 0.2 or more and 0.4 or less, may be 0.2 or more and 0.3 or less, may be 0.3 or more and 0.8 or less, may be 0.3 or more and 0.7 or less, may be 0.3 or more and 0.6 or less, may be 0.3 or more and 0.4 or less, may be 0.4 or more and 0.8 or less, may be 0.4 or more and 0.7 or less, may be 0.4 or more and 0.6 or less, may be 0.6 or more and 0.8 or less, may be 0.6 or more and 0.7 or less, or may be 0.7 or more and 0.8 or less.

In the first mask regions M1, as illustrated in FIG. 8 and FIG. 9, each through-hole 25 may include a first recess 30, the second recess 35, and a ridge line 41. The second recess 35 is in communication with the first recess 30. Consequently, the through-hole 25 extend from the first surface 20a to the second surface 20b. The first recess 30 and the second recess 35 are formed by etching an elongated metal plate 64 that is the material of the deposition mask 20 from both surfaces.

Each first recess 30 may be located at the first surface 20a. The first recess 30 has a first wall surface 31. The opening of each through-hole 25 in a section along the first surface 20a may gradually expand from the ridge line 41 described later toward the first surface 20a. The first wall surface 31 may be formed such that the distance from the central axis CL of the through-hole 25 increases in a direction from the ridge line 41 toward the first surface 20a. The first wall surface 31 may curve. The first wall surface 31 may curve such that the first recess 30 expands toward the outside.

Each second recess 35 may be located at the second surface 20b. The second recess 35 has a second wall surface 36. The opening of each through-hole 25 in a section along the second surface 20b may gradually expand in a direction from the ridge line 41 toward the second surface 20b. The second wall surface 36 may be formed such that the distance from the central axis CL of the through-hole 25 increases in a direction from the ridge line 41 toward the second surface 20b. The second wall surface 36 may curve. The second wall surface 36 may curve such that the second recess 35 expands toward the outside.

The opening of each second recess 35 in a section along the second surface 20b may be wider than the opening of each first recess 30 in a section along the first surface 20a.

The ridge lines 41 may be connected to the first wall surfaces 31 of the first recesses 30 and the second wall surfaces 36 of the second recesses 35. The ridge lines 41 may extend inward in the through-holes 25. The ridge lines 41 may be located on the position that project inward in the through-hole 25. The ridge lines 41 may extend in the circumferential direction of the through-holes 25 in a plan view. The ridge lines 41 may be closer to the first surface 20a than the second surface 20b. The height of each ridge line 41 from the first surface 20a is also referred to as a sectional height. The sectional height can affect shadow. The ridge lines 41 may define through-portions 42 at which the opening areas of the through-holes 25 are smallest in a plan view of the deposition mask 20.

As illustrated in FIG. 8, the multiple through-holes 25 may be arranged in parallel. The multiple through-holes 25 may be arranged in the first mask direction D1 and may be arranged in the second mask direction D2 in a plan view. The multiple through-holes 25 in the first mask regions M1 may be arranged at an array pitch C1 in the first mask direction D1. The multiple through-holes 25 in the first mask regions M1 may be arranged at an array pitch C2 in the second mask direction D2. The array pitches C1 and C2 of the through-holes 25 may be determined depending on the pixel density of a projection device or the organic device 100.

For example, the array pitch C1 may be 20 µm or more, may be 50 µm or more, or may be 80 µm or more. For example, the array pitch C1 may be 110 µm or less, may be 140 µm or less, or may be 170 µm or less. The range of the array pitch C1 may be determined by using a first group consisting of 20 µm, 50 µm, and 80 µm and/or a second group consisting of 110 µm, 140 µm, and 170 µm. The range of the array pitch C1 may be determined by using a combination of a value freely selected from the values in the first group described above and a value freely selected from the values in the second group described above. The range of the array pitch C1 may be determined by using a combination of two values freely selected from the values in the first group described above. The range of the array pitch C1 may be determined by using a combination of two values freely selected from the values in the second group described above. For example, the range may be 20 µm or more and 170 µm or less, may be 20 µm or more and 140 µm or less, may be 20 µm or more and 110 µm or less, may be 20 µm or more and 80 µm or less, may be 20 µM or more and 50 µm or less, may be 50 µm or more and 170 µm or less, may be 50 µm or more and 140 µm or less, may be 50 µm or more and 110 µM or less, may be 50 µm or more and 80 µm or less, may be 80 µm or more and 170 µm or less, may be 80 µm or more and 140 µm or less, may be 80 µm or more and 110 µm or less, may be 110 µm or more and 170 µm or less, may be 110 µm or more and 140 µm or less, or may be 140 µm or more and 170 µm or less. The range of the array pitch C1 may correspond to that for a display region of 150 ppi or more and 1200 ppi or less.

For example, the array pitch C2 may be 20 µm or more, may be 50 µm or more, or may be 80 µm or more. For example, the array pitch C2 may be 110 µm or less, may be 140 µm or less, or may be 170 µm or less. The range of the array pitch C2 may be determined by using the first group consisting of 20 µM, 50 µm, and 80 µm and/or the second group consisting of 110 µm, 140 µm, and 170 µm. The range of the array pitch C2 may be determined by using a combination of a value freely selected from the values in the first group described above and a value freely selected from the values in the second group described above. The range of the array pitch C2 may be determined by using a combination of two values freely selected from the values in the first group described above. The range of the array pitch C2 may be determined by using a combination of two values freely selected from the values in the second group described above. For example, the range may be 20 µm or more and 170 µm or less, may be 20 µm or more and 140 µm or less, may be 20 µm or more and 110 µm or less, may be 20 µm or more and 80 µm or less, may be 20 µm or more and 50 µm or less, may be 50 µm or more and 170 µm or less, may be 50 µm or more and 140 µm or less, may be 50 µm or more and 110 µm or less, may be 50 µm or more and 80 µm or less, may be 80 µm or more and 170 µm or less, may be 80 µm or more and 140 µm or less, may be 80 µm or more and 110 µm or less, may be 110 µm or more and 170 µm or less, may be 110 µm or more and 140 µm or less, or may be 140 µm or more and 170 µm or less. The range of the array pitch C2 may correspond to that for a display region of 150 ppi or more and 1200 ppi or less.

As illustrated in FIG. 8, each through-hole 25 may have a contour that has a substantially rectangular shape in a plan view. In this case, four corners of the contour of the through-hole 25 may curve. In FIG. 8, the longitudinal direction of the through-hole 25 may coincide with the second mask direction D2. The shape of the contour of the through-hole 25 may be freely selected depending on the shape of each pixel. For example, the contour of the through-hole 25 may have another polygonal shape such as a hexagonal shape or an octagonal shape or may have a circular shape. The shape of the contour of the through-hole 25 may be a combination of multiple shapes. The shape of the contour of the through-hole 25 may differ from that of another through-hole 25. In the case where the shape of the contour of the through-hole 25 is a polygonal shape, a dimension of the opening of the through-hole 25 may be a distance between two sides of the polygonal shape that face each other.

In FIG. 9 and FIG. 10, dimensions of the opening of each through-hole 25 on the first surface 20a of the deposition mask 20 are illustrated by reference characters S1 and S2. The reference characters S1 represent the dimension of the opening of the through-hole 25 in the first mask direction D1. The reference characters S2 represent the dimension of the opening of the through-hole 25 in the second mask direction D2. S2 is larger than S1. However, the present disclosure is not limited thereto, and S1 may be larger than S2. A planar shape of the through-hole 25 may be a square shape. In this case, S1 is equal to S2.

For example, the reference characters S1 may represent 10 µm or more, may represent 30 µm or more, or may represent 50 µm or more. For example, the reference characters S1 may represent 75 µm or less, may represent 95 µm or less, or may represent 115 µm or less. The range of the reference characters S1 may be determined by using a first group consisting of 10 µm, 30 µm, and 50 µm and/or a second group consisting of 75 µm, 95 µm, and 115 µm. The range of the reference characters S1 may be determined by using a combination of a value freely selected from the values in the first group described above and a value freely selected from the values in the second group described above. The range of the reference characters S1 may be determined by using a combination of two values freely selected from the values in the first group described above. The range of the reference characters S1 may be determined by using a combination of two values freely selected from the values in the second group described above. For example, the range may be 10 µm or more and 115 µm or less, may be 10 µm or more and 95 µm or less, may be 10 µm or more and 75 µm or less, may be 10 µm or more and 50 µm or less, may be 10 µm or more and 30 µm or less, may be 30 µm or more and 115 µm or less, may be 30 µm or more and 95 µm or less, may be 30 µm or more and 75 µm or less, may be 30 µm or more and 50 µm or less, may be 50 µm or more and 115 µm or less, may be 50 µm or more and 95 µm or less, may be 50 µm or more and 75 µm or less, may be 75 µm or more and 115 µm or less, may be 75 µm or more and 95 µm or less, or may be 95 µm or more and 115 µm or less.

For example, the reference characters S2 may represent 10 µm or more, may represent 30 µm or more, or may represent 50 µm or more. For example, the reference characters S2 may represent 75 µm or less, may represent 95 µm or less, or may represent 115 µm or less. The range of the reference characters S2 may be determined by using the first group consisting of 10 µm, 30 µm, and 50 µm and/or the second group consisting of 75 µm, 95 µm, and 115 µm. The range of the reference characters S2 may be determined by using a combination of a value freely selected from the values in the first group described above and a value freely selected from the values in the second group described above. The range of the reference characters S2 may be determined by using a combination of two values freely selected from the values in the first group described above. The range of the reference characters S2 may be determined by using a combination of two values freely selected from the values in the second group described above. For example, the range may be 10 µm or more and 115 µm or less, may be 10 µm or more and 95 µm or less, may be 10 µm or more and 75 µm or less, may be 10 µm or more and 50 µm or less, may be 10 µm or more and 30 µm or less, may be 30 µM or more and 115 µm or less, may be 30 µm or more and 95 µm or less, may be 30 µm or more and 75 µm or less, may be 30 µM or more and 50 µm or less, may be 50 µM or more and 115 µm or less, may be 50 µm or more and 95 µm or less, may be 50 µM or more and 75 µm or less, may be 75 µm or more and 115 µm or less, may be 75 µm or more and 95 µm or less, or may be 95 µm or more and 115 µm or less.

As illustrated in FIG. 8 to FIG. 11, two first recesses 30 adjacent to each other may be separated from each other. The two first recess 30 adjacent to each other may be separated from each other in both of the first mask direction D1 and the second mask direction D2. The first surface 20a may remain between the first recesses 30 adjacent to each other. The first surface 20a may remain around the first recesses 30 in a plan view. The first recesses 30 may be surrounded by the first surface 20a. A sash bar 43 described later may be located between the first recesses 30 adjacent to each other. The sash bar 43 corresponds to a portion of the metal material that is not etched but remains between the through-holes 25 adjacent to each other. As illustrated in FIG. 8, each deposition mask 20 may include multiple sash bars 43 that extend in the first mask direction D1 and multiple sash bars 43 that extend in the second mask direction D2.

In the first mask regions M1, two second recesses 35 adjacent to each other may be connected to each other. More specifically, as illustrated in FIG. 8 and FIG. 9, the two second recesses 35 adjacent to each other in the first mask direction D1 may be connected to each other. The second surface 20b may not remain between the two second recesses 35 adjacent to each other in the first mask direction D1. Similarly, as illustrated in FIG. 8 and FIG. 10, two second recesses 35 adjacent to each other in the second mask direction D2 may be connected to each other. The second surface 20b may not remain between the two second recesses 35 adjacent to each other in the second mask direction D2.

As illustrated in FIG. 8 and FIG. 11, two second recesses 35 adjacent to each other in a third mask direction D3 that inclines with respect to both of the first mask direction D1 and the second mask direction D2 may be separated from each other. The third mask direction D3 roughly corresponds to a diagonal direction of each through-hole 25 in a plan view. The third mask direction D3 corresponds to a direction in which the line E-E in FIG. 8 extends. The second surface 20b may remain between the two second recesses 35 adjacent to each other in the third mask direction D3. The sash bar 43 that is located between the two second recesses 35 adjacent to each other may have a top surface 44. The top surface 44 corresponds to a portion of the second surface 20b that is not etched but remains. Manufacturing each deposition mask 20 such that the top surface 44 remains enables the thickness t of the deposition mask 20 to be maintained and enables the mechanical strength of the deposition mask 20 to be improved. In this case, the deposition mask 20 can be inhibited from deforming and being damaged, for example, during transportation.

As illustrated in FIG. 8 to FIG. 11, the sash bar 43 described above is located between the second wall surfaces 36 of the second recesses 35 adjacent to each other. The sash bar 43 extends from a portion between the first wall surfaces 31 of the first recesses 30 adjacent to each other to a portion between the second wall surfaces 36 of the second recesses 35 adjacent to each other. The sash bar 43 has a connection surface 45 that connects the second wall surfaces 36 of the second recesses 35 adjacent to each other. The second recess 35 that is included in one of the through-holes 25 around which another through-hole 25 is located in a plan view is surrounded by the connection surfaces 45 in the plan view. The sash bar 43 may not be formed outside the through-holes 25 along the outer edge of one of the effective regions 23.

As illustrated in FIG. 9, the connection surface 45 may include a ridge surface 47 that is located between the second recesses 35 adjacent to each other in the first mask direction D1. The ridge surface 47 that is located between the second recesses 35 adjacent to each other in the first mask direction D1 may curve so as to be convex toward the second surface 20b. The ridge surface may be formed as a ridge. Reference characters h1 illustrated in FIG. 9 represent the height of the ridge surface 47 that is located between the second recesses 35 adjacent to each other in the first mask direction D1 and a height from the first surface 20a. The reference characters h1 represent the height of the ridge surface 47 in a section that passes through the center of the through-holes 25 in a plan view. The height of the ridge surface 47 may gradually increase in a direction from a position on the section toward the top surface 44.

As illustrated in FIG. 10, the ridge surface 47 is located between the second recesses 35 adjacent to each other in the second mask direction D2. The ridge surface 47 that is located between the second recesses 35 adjacent to each other in the second mask direction D2 may curve so as to be convex toward the second surface 20b. Reference characters h2 illustrated in FIG. 10 represent the height of the ridge surface 47 that is located between the second recesses 35 adjacent to each other in the second mask direction D2 and a height from the first surface 20a. The ridge surface 47 may be formed as a ridge. The reference characters h2 represent the height of the ridge surface 47 in a section that passes through the center of the through-holes 25 in a plan view. The height of the ridge surface 47 may gradually increase in a direction from a position on the section toward the top surface 44 described later. The height h2 may be less than the height h1.

As illustrated in FIG. 11, the connection surface 45 is located between the two second recesses 35 adjacent to each other in the third mask direction D3 described above. Reference characters h3 illustrated in FIG. 11 represent the height of the connection surface 45 that is located between the second recesses 35 adjacent to each other in the third mask direction D3 and a height from the first surface 20a. The height h3 may be greater than the height h1 described above and may be greater than the height h2 described above.

According to the present embodiment, the connection surface 45 that is located between the two second recesses 35 adjacent to each other in the third mask direction D3 may have the top surface 44 described above. Since the top surface 44 is a portion of the second surface 20b that is not etched but remains, the top surface 44 is flush with the second surface 20b. The top surface 44 is included in the second surface 20b that remains. The height h3 according to the present embodiment corresponds to the thickness t of the deposition mask 20.

According to the present embodiment, the top surface 44 corresponding to the portion that has the height h3 has a highest point 46 on the connection surface 45. In other words, the connection surfaces 45 that surround one of the second recesses 35 have the highest points 46 that the top surfaces 44 closest to the second surface 20b have. According to the present embodiment, the multiple through-holes 25 are arranged in parallel in the first mask direction D1 and in the second mask direction D2, and accordingly, the connection surface 45 that surround one of the second recesses 35 include four top surfaces 44. The four top surfaces 44 are located in the diagonal directions described above with respect to the second recess 35. The four top surfaces 44 are flush with the second surface 20b of the deposition mask 20 in the normal direction N. The top surfaces 44 may be flat as in the second surface 20b. Portions of the connection surfaces 45 other than the top surfaces 44 may be formed as the ridge surfaces 47 so as to curve and so as to have a convex shape toward the second surface 20b.

According to the present embodiment, the angles of inclination of the wall surfaces of the through-holes 25 with respect to the first surface 20a of the deposition mask 20 are roughly small. The angles of inclination of the through-holes 25 are defined by the second wall surfaces 36 of the second recesses 35 and the sash bars 43 described above. This will now be described by using an inclination definition line L.

The inclination definition line L is defined as a straight line that is in contact with one of the connection surfaces 45 and one of the ridge lines 41 in a definition section. The definition section passes through a freely selected point on the connection surface 45 and is perpendicular to the first surface 20a of deposition mask 20. The definition section passes through a point on the ridge line 41 such that the distance from the freely selected point is shortest in a plan view.

According to the present embodiment, as illustrated in FIG. 11, an angle θ3 that is formed between the inclination definition line L and the first surface 20a may be 25° or more and 45° or less where the definition section passes through one of the highest points 46.

For example, the angle θ3 may be 25° or more, may be 28° or more, or may be 30° or more. For example, the angle θ3 may be 40° or less, may be 42° or less, or may be 45° or less. When the angle θ3 is 45° or less, the sectional height of each through-hole 25 can dominantly affect the shadow, and another factor such as the size of each top surface 44 can be inhibited from affecting the shadow. The range of the angle θ3 may be determined by using a first group consisting of 25°, 28°, and 30° and/or a second group consisting of 40°, 42°, and 45°. The range of the angle θ3 may be determined by using a combination of a value freely selected from the values in the first group described above and a value freely selected from the values in the second group described above. The range of the angle θ3 may be determined by using a combination of two values freely selected from the values in the first group described above. The range of the angle θ3 may be determined by using a combination of two values freely selected from the values in the second group described above. For example, the range may be 25° or more and 45° or less, may be 25° or more and 42° or less, may be 25° or more and 40° or less, may be 25° or more and 30° or less, may be 25° or more and 28° or less, may be 28° or more and 45° or less, may be 28° or more and 42° or less, may be 28° or more and 40° or less, may be 28° or more and 30° or less, may be 30° or more and 45° or less, may be 30° or more and 42° or less, may be 30° or more and 40° or less, may be 40° or more and 45° or less, may be 40° or more and 42° or less, or may be 42° or more and 45° or less.

In FIG. 8, an example of the definition section that passes through one of the highest points 46 that are located on the top surfaces 44 of the sash bars 43 is illustrated by using the line E-E. The line E-E extends in the third mask direction D3 described above. The line E-E may not pass through the center of the through-hole 25. The definition section illustrated by using the line E-E passes through a freely selected point on the top surfaces 44 and passes through a point on one of the ridge lines 41 such that the planar distance from the freely selected point to the ridge line 41 is shortest. In FIG. 8, the definition section is illustrated as a straight line and overlaps the inclination definition line L that is defined in the definition section.

According to the present embodiment, the highest points 46 on the connection surfaces 45 are located on the top surfaces 44. The top surfaces 44 are flush with the second surface 20b in the normal direction N. The top surfaces 44 have planar regions that two-dimensionally extend, which are not points. In this case, the highest points 46 may be points on the top surfaces 44 closest to the ridge lines 41 in a plan view. In this case, the inclination definition line L may pass through one of the highest points 46.

In FIG. 8, a definition section that extends in the first mask direction D1 is illustrated by using the line C-C. The line C-C passes through the centers of some of the through-holes 25. FIG. 9 illustrates the definition section that extends in the line C-C illustrated in FIG. 8. An inclination definition line L illustrated is in contact with one of the ridge lines 41 and the ridge surface 47 that is included in one of the connection surfaces 45 in the definition section. An angle that is formed between the direction in which the inclination definition line L extends and the first surface 20a is illustrated by reference characters θ1. The angle θ1 may be 25° or more and 45° or less as in the angle θ3 described above.

Similarly, in FIG. 8, a definition section that extends in the second mask direction D2 is illustrated by using the line D-D. The line D-D passes through the centers of some of the through-holes 25. In FIG. 10, the definition section that extends in the line D-D illustrated in FIG. 8 is illustrated. An inclination definition line L illustrated is in contact with one of the ridge lines 41 and the ridge surface 47 that is included in one of the connection surfaces 45 in the definition section. An angle that is formed between the direction in which the inclination definition line L extends and the first surface 20a is illustrated by using reference characters θ2. The angle θ2 may be 25° or more and 45° or less as in the angle θ3 described above.

The connection surface 45 that surround one of the second recesses 35 include four top surfaces 44 as described above. Four definition sections that pass through the highest point 46 that is located on the respective top surfaces 44 among the four top surfaces 44 can be defined. The angle θ3 that is formed between the first surface 20a and the inclination definition line L in at least one of the definition sections among the four definition sections may be 45° or less. For example, the angle θ3 that is formed between the first surface 20a and the inclination definition line L in a definition section among the four definition sections may be 25° or more and 45° or less. In this case, the angle θ3 that is formed between the first surface 20a and the inclination definition line L in the other three definition sections may not be 45° or less. Alternatively, the angle θ3 that is formed between the first surface 20a and the inclination definition line L, for example, in two or three definition sections among the four definition sections may be 45° or less. In this case, the angle θ3 that is formed between the first surface 20a and the inclination definition line L in another definition section may not be 45° or less.

According to the present embodiment, an angle θ that is formed between the first surface 20a and the inclination definition line L in the four definition sections may be 25° or more and 45° or less. In this case, an angle that is formed between the first surface 20a and the inclination definition line L in a definition section that passes through a freely selected point that is not on the top surfaces 44 among points on the connection surfaces 45 may be 25° or more and 45° or less. In other words, an angle that is formed between the first surface 20a and the inclination definition line L in a definition section that passes through a freely selected point among the points on the connection surfaces 45 may be 25° or more and 45° or less. For example, the angle θ1 that is formed between the first surface 20a and the inclination definition line L in the definition section illustrated in FIG. 9 may be 45° or less. For example, the angle θ2 that is formed between the first surface 20a and the inclination definition line L in the definition section illustrated in FIG. 10 may be 45° or less. The angle θ1 may be smaller than the angle θ3. The angle θ2 may be smaller than the angle θ1.

The second mask regions M2 will be described with reference to FIG. 12 and FIG. 13.

In the second mask regions M2, multiple through-holes 25 are formed as in the first mask regions M1. The multiple through-holes 25 in the second mask regions M2 may be arranged in parallel. The multiple through-holes 25 in the second mask regions M2 may be arranged at an array pitch C3 in the first mask direction D1. The array pitch C3 may be larger than the array pitch C1 illustrated in FIG. 8. The multiple through-holes 25 in the second mask regions M2 may be arranged at an array pitch C4 in the second mask direction D2. The array pitch C4 may be larger than the array pitch C2 illustrated in FIG. 8. The array pitches C3 and C4 of the through-holes 25 may be determined depending on the function of the second display region 102.

For example, the array pitch C3 may be 35 μm or more, may be 70 μm or more, or may be 100 μm or more. For example, the array pitch C3 may be 240 μm or less, may be 270 μm or less, or may be 300 μm or less. The range of the array pitch C3 may be determined by using a first group consisting of 35 μm, 70 μm, and 100 μm and/or a second group consisting of 240 μm, 270 μm, and 300 μm. The range of the array pitch C3 may be determined by using a combination of a value freely selected from the values in the first group described above and a value freely selected from the values in the second group described above. The range of the array pitch C3 may be determined by using a combination of two values freely selected from the values in the first group described above. The range of the array pitch C3 may be determined by using a combination of two values freely selected from the values in the second group described above. For example, the range may be 35 μm or more and 300 μm or less, may be 35 μm or more and 270 μm or less, may be 35 μm or more and 240 μm or less, may be 35 μm or more and 100 μm or less, may be 35 μm or more and 70 μm or less, may be 70 μm or more and 300 μm or less, may be 70 μm or more and 270 μm or less, may be 70 μm or more and 240 μM or less, may be 70 μm or more and 100 μm or less, may be 100 μm or more and 300 μm or less, may be 100 μm or more and 270 μm or less, may be 100 μm or more and 240 μm or less, may be 240 μm or more and 300 μm or less, may be 240 μm or more and 270 μm or less, or may be 270 μm or more and 300 μm or less.

For example, the array pitch C4 may be 35 μm or more, may be 70 μm or more, or may be 100 μm or more. For example, the array pitch C4 may be 240 μm or less, may be 270 μm or less, or may be 300 μm or less. The range of the array pitch C4 may be determined by using the first group consisting of 35 μm, 70 μm, and 100 μm and/or the second group consisting of 240 μm, 270 μm, and 300 μM. The range of the array pitch C4 may be determined by using a combination of a value freely selected from the values in the first group described above and a value freely selected from the values in the second group described above. The range of the array pitch C4 may be determined by using a combination of two values freely selected from the values in the first group described above. The range of the array pitch C4 may be determined by using a combination of two values freely selected from the values in the second group described above. For example, the range may be 35 μm or more and 300 μm or less, may be 35 μm or more and 270 μm or less, may be 35 μm or more and 240 μm or less, may be 35 μm or more and 100 μm or less, may be 35 μm or more and 70 μm or less, may be 70 μm or more and 300 μm or less, may be 70 μm or more and 270 μm or less, may be 70 μM or more and 240 μm or less, may be 70 μm or more and 100 μm or less, may be 100 μm or more and 300 μm or less, may be 100 μm or more and 270 μm or less, may be 100 μm or more and 240 μm or less, may be 240 μm or more and 300 μm or less, may be 240 μm or more and 270 μm or less, or may be 270 μm or more and 300 μm or less.

In the second mask regions M2, two second recesses 35 adjacent to each other may be separated from each other. More specifically, as illustrated in FIG. 12 and FIG. 13, two second recesses 35 adjacent to each other in the first mask direction D1 may be separated from each other. The second surface 20b may remain between the two second recesses 35 adjacent to each other in the first mask direction D1. Similarly, two second recesses 35 adjacent to each other in the second mask direction D2 may be separated from each other. The second surface 20b may remain between the two second recesses 35 adjacent to each other in the second mask direction D2. Similarly, two second recesses 35 adjacent to each other in the third mask direction D3 described above may be separated from each other. The second surface 20b may remain between the two second recesses 35 adjacent to each other in the third mask direction D3. In the second mask regions M2, the second surface 20b may remain around the second recesses 35 in a plan view and the second recesses 35 may be surrounded by the second surface 20b.

In the second mask regions M2, each sash bar 43 that is located between the two second recesses 35 adjacent to each other may have the top surface 44 described above.

The first mask region M1 thus configured has a first surface remaining ratio that represents the remaining area ratio of the second surface 20b. The first surface remaining ratio is calculated by dividing the total area of the second surface 20b that remains in the first mask region M1 by the area of the first mask region M1 described above. In an example illustrated in FIG. 8, the second surface 20b that remains in the first mask region M1 includes the top surfaces 44 that are illustrated by inclined lines and portions that are formed near the boundary of the first mask region M1. The second mask region M2 thus configured has a second surface remaining ratio that represents the remaining area ratio of the second surface 20b. The second surface remaining ratio is calculated by dividing the total area of the second surface 20b that remains in the second mask region M2 by the area of the second mask region M2 described above. In an example illustrated in FIG. 12, the second surface 20b that remains in the second mask region M2 corresponds to a portion illustrated by inclined lines. The second surface remaining ratio may be higher than the first surface remaining ratio. However, the second surface remaining ratio may be equal to the first surface remaining ratio.

For example, the ratio of the second surface remaining ratio to the first surface remaining ratio may be 1.0 or more, may be 2.0 or more, or may be 3.0 or more. For example, the ratio of the second surface remaining ratio to the first surface remaining ratio may be 8.0 or less, may be 9.0 or less, or may be 10.0 or less. The range of the ratio of the second surface remaining ratio to the first surface remaining ratio may be determined by using a first group consisting of 1.0, 2.0, and 3.0, and/or a second group consisting of 8.0, 9.0, and 10.0. The range of the ratio of the second surface remaining ratio to the first surface remaining ratio may be determined by using a combination of a value freely selected from the values in the first group described above and a value freely selected from the values in the second group described above. The range of the ratio of the second surface remaining ratio to the first surface remaining ratio may be determined by using a combination of two values freely selected from the values in the first group described above. The range of the ratio of the second surface remaining ratio to the first surface remaining ratio may be determined by using a combination of two values freely selected from the values in the second group described above. For example, the range may be 1.0 or more and 10.0 or less, may be 1.0 or more and 9.0 or less, may be 1.0 or more and 8.0 or less, may be 1.0 or more and 3.0 or less, may be 1.0 or more and 2.0 or less, may be 2.0 or more and 10.0 or less, may be 2.0 or more and 9.0 or less, may be 2.0 or more and 8.0 or less, may be 2.0 or more and 3.0 or less, may be 3.0 or more and 10.0 or less, may be 3.0 or more and 9.0 or less, may be 3.0 or more and 8.0 or less, may be 8.0 or more and 10.0 or less, may be 8.0 or more and 9.0 or less, or may be 9.0 or more and 10.0 or less.

An angle θ4 that is formed between the first surface 20a and the inclination definition line L in a definition section illustrated in FIG. 13 may be 45° or less. The angle θ4 may be 25° or more and 45° or less. The angle θ4 may be equal to the angle θ3.

The technical significance of the angles θ1 to θ4 will be described. In a deposition process for depositing the deposition material 90 on the substrate 110 by using the deposition mask 20, a part of the deposition material 90 comes in the normal direction N from the deposition source 83 toward the substrate 110. However, a part of the deposition material 90 can come in a direction that inclines with respect to the normal direction N. In this case, the part of the deposition material 90 that comes in the inclining direction does not reach the substrate 110 but reaches and attaches to the wall surfaces of the through-holes 25 and the second surface 20b of the deposition mask 20. As for the through-holes 25, the part is likely to be attached to the second wall surfaces 36 of the second recesses 35. For this reason, the thickness of the deposition layer that is formed on the substrate 110 is likely to decrease as the position thereof is nearer to the wall surfaces of the through-holes 25. Such a phenomenon in which attachment of the deposition material 90 to the substrate 110 is impeded by the wall surfaces of the through-holes 25 and the second surface 20b of the deposition mask 20 is referred to as the shadow.

A conceivable measure for reducing the occurrence of the shadow is to decrease the thickness t of the deposition mask 20. For this reason, the thickness t may be decreased to such an extent that the mechanical strength of the deposition mask 20 can be maintained. However, the angles θ1 to θ4 described above may be decreased with the thickness t maintained in order to maintain the mechanical strength of the deposition mask 20. Among the angles θ1 to θ4, the angle θ3 illustrated in FIG. 11 and the angle θ4 illustrated in FIG. 13 are most likely to increase. In view of this, according to the present embodiment, the angle θ3 and the angle θ4 are set to be 45° or less as described above in order to reduce the occurrence of the shadow.

For example, the thickness t of the deposition mask 20 may be 5 μm or more, may be 8 μm or more, may be 10 μm or more, or may be 15 μm or more. When the thickness t of the deposition mask 20 is 5 μm or more, the mechanical strength of the deposition mask 20 can be maintained, and the deposition mask 20 can be inhibited from being damaged and deforming. For example, the thickness t of the deposition mask 20 may be 20 μM or less, may be 25 μm or less, may be 30 μm or less, or may be 35 μm or less. When the thickness t of the deposition mask 20 is 35 μm or less, the occurrence of the shadow can be reduced. The range of the thickness t of the deposition mask 20 may be determined by a first group consisting of 5 μm, 8 μm, 10 μm, and 15 μm and/or a second group consisting of 20 μm, 25 μm, 30 μm, and 35 μm. The range of the thickness t of the deposition mask 20 may be determined by using a combination of a value freely selected from the values in the first group described above and a value freely selected from the values in the second group described above. The range of the thickness t of the deposition mask 20 may be determined by using a combination of two values freely selected from the values in the first group described above. The range of the thickness t of the deposition mask 20 may be determined by using a combination of two values freely selected from the values in the second group described above. For example, the range may be 5 μm or more and 35 μm or less, may be 5 μm or more and 30 μm or less, may be 5 μm or more and 25 μm or less, may be 5 μm or more and 20 μm or less, may be 5 μm or more and 15 μm or less, may be 5 μm or more and 10 μm or less, may be 5 μm or more and 8 μm or less, may be 8 μm or more and 35 μm or less, may be 8 μm or more and 30 μm or less, may be 8 μm or more and 25 μm or less, may be 8 μm or more and 20 μm or less, may be 8 μm or more and 15 μm or less, may be 8 μm or more and 10 μm or less, may be 10 μm or more and 35 μm or less, may be 10 μm or more and 30 μm or less, may be 10 μm or more and 25 μm or less, may be 10 μm or more and 20 μm or less, may be 10 μm or more and 15 μm or less, may be 15 μm or more and 35 μm or less, may be 15 μm or more and 30 μm or less, may be 15 μm or more and 25 μm or less, may be 15 μm or more and 20 μm or less, may be 20 μm or more and 35 μm or less, may be 20 μm or more and 30 μm or less, may be 20 μm or more and 25 μm or less, may be 25 μm or more and 35 μm or less, may be 25 μm or more and 30 μm or less, or may be 30 μm or more and 35 μm or less. The thickness t is the thickness of the peripheral region 24, that is, the thickness of a portion of the deposition mask 20 at which the first recesses 30 and the second recesses 35 are not formed. Accordingly, the thickness can also be said as the thickness t of the deposition mask 20.

Examples of the material of the deposition mask 20 may include an iron alloy containing nickel. The iron alloy may contain cobalt in addition to nickel. For example, the material of the deposition mask 20 may be an iron alloy containing 30 mass % or more and 54 mass % or less nickel and cobalt in total and 0 mass % or more and 6 mass % or less cobalt. Specific examples of the iron alloy containing nickel or the iron alloy containing nickel and cobalt include an invar material containing 34 mass % or more and 38 mass % or less nickel, a super invar material containing cobalt in addition to 30 mass % or more and 34 mass % or less nickel, and a low thermal expansion Fe—Ni plating alloy containing 38 mass % or more and 54 mass % or less nickel. The use of these alloys enables the thermal expansion coefficient of the deposition mask 20 to be decreased. For example, in the case where a glass substrate is used as the substrate 110, the thermal expansion coefficient of the deposition mask 20 can be decreased to the level of that of the glass substrate. This inhibits the precision of the dimensions of the organic layers 130 that are formed on the substrate 110 and the precision of the positions thereof from decreasing due to the difference in thermal expansion coefficient between the deposition mask 20 and the substrate 110 in the deposition process.

The material of the frame 15 may be the same as the material of the deposition mask 20 described above. For example, the material of the frame 15 may contain an iron alloy containing nickel.

A manufacturing method for each deposition mask 20 described above will now be described.

Manufacturing Method for Deposition Mask

Figure 14:
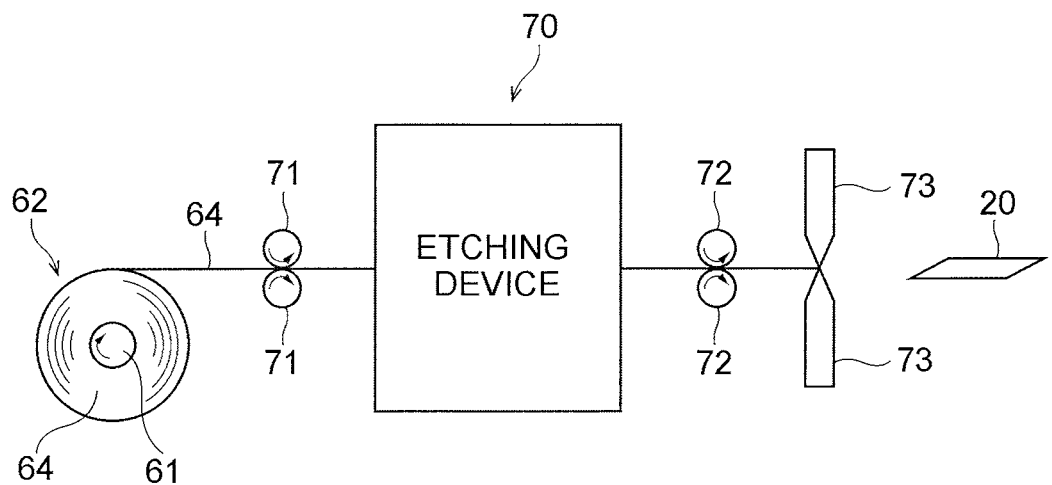
FIG. 14 is a schematic diagram for generally describing an example of a manufacturing method for the deposition mask illustrated in FIG. 6.

A manufacturing method for the deposition mask 20 by using the elongated metal plate 64 will now be described mainly with reference to FIG. 14 to FIG. 22. In the manufacturing method for the deposition mask 20 described below, as illustrated in FIG. 14, the elongated metal plate 64 is supplied, and the through-holes 25 are formed in the elongated metal plate 64. Subsequently, the elongated metal plate 64 is cut, and the deposition mask 20 composed of a sheet-like metal plate is obtained. FIG. 14 illustrates a manufacturing apparatus for manufacturing the deposition mask 20. In an example illustrated in FIG. 14 to FIG. 22, a section of the first mask region M1 of the deposition mask 20 is illustrated. The through-holes 25 are formed in the second region M2 in the same manner.

More specifically, the manufacturing method for the deposition mask 20 may include a metal plate preparation process, a first etching process, and a second etching process. In the metal plate preparation process, the elongated metal plate 64 that has a belt-like shape may be prepared. In the first etching process, etching processing may be performed on the elongated metal plate 64 by using a photolithography technique. Consequently, the first recesses 30 may be formed on a first surface 64a of the elongated metal plate 64. In the second etching process, etching processing may be performed on the elongated metal plate 64 by using a photolithography technique. Consequently, the second recesses 35 may be formed on a second surface 64b of the elongated metal plate 64. The second recesses 35 and the first recesses 30 that are formed on the elongated metal plate 64 may be in communication with each other, and the through-holes 25 may be formed in the elongated metal plate 64. The processes will now be described in detail.

In the metal plate preparation process, a winding 62 may be prepared by winding the elongated metal plate 64 around a supply core 61. The elongated metal plate 64 may be unwound from the winding 62 around the supply core 61 by rotatably driving drive rollers 72 that are located downstream of an etching device 70. Consequently, as illustrated in FIG. 14, the elongated metal plate 64 that has a belt-like shape is supplied to the etching device 70. The elongated metal plate 64 may be guided to the etching device 70 by using transport rollers 71. The etching device 70 may perform processes illustrated below.

Figure 15:
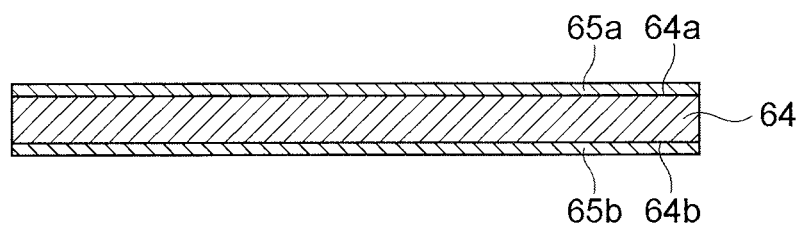
FIG. 15 is a sectional view illustrating a process of forming resist layers on an elongated metal plate for describing the example of the manufacturing method for the deposition mask illustrated in FIG. 6.

In a resist layer formation process after the metal plate preparation process, as illustrated in FIG. 15, resist layers 65a and 65b may be formed on the first surface 64a and the second surface 64b of the elongated metal plate 64. The resist layers 65a and 65b may contain a negative photosensitive resist material. The resist layers 65a and 65b may be dry films that have layers containing a photosensitive resist material such as acrylic photocurable resin. The dry films may be bonded to the first surface 64a and the second surface 64b of the elongated metal plate 64. The resist layers 65a and 65b may be formed by using a liquid resist. In this case, the liquid resist may be first applied to the first surface 64a and the second surface 64b of the elongated metal plate 64. Subsequently, baking may be followed as needed. Consequently, the resist layers 65a and 65b may be formed.

Figure 16:
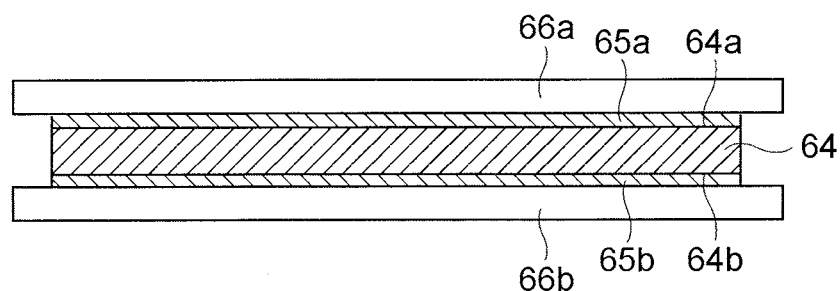
FIG. 16 is a sectional view illustrating a process of bringing exposure masks into close contact with the resist layers for describing the example of the manufacturing method for the deposition mask illustrated in FIG. 6.

In an exposure process after the resist layer formation process, the resist layers 65a and 65b may be exposed to light. In this case, as illustrated in FIG. 16, exposure masks 66a and 66b may be disposed on the resist layers 65a and 65b. The exposure masks 66a and 66b may be configured to prevent light from passing to a region to be removed. A positive photosensitive resist material may be used instead of the negative photosensitive resist material. In this case, exposure masks that allow light to pass to regions of the resist layers 65a and 65b to be removed may be used as the exposure masks. Subsequently, the resist layers 65a and 65b may be exposed to light by using the exposure masks 66a and 66b.

Figure 17:
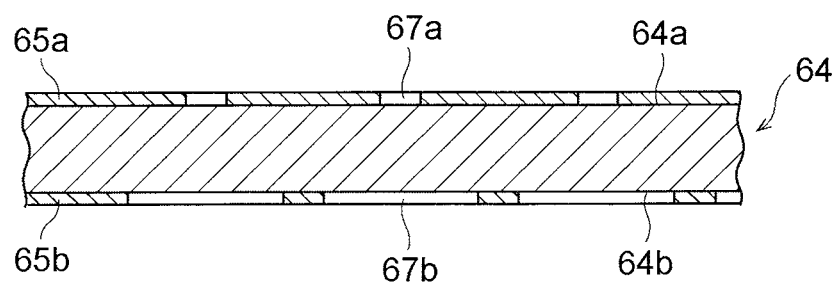
FIG. 17 illustrates a process of developing the resist layers for describing the example of the manufacturing method for the deposition mask illustrated in FIG. 6.

In a development process after the exposure process, as illustrated in FIG. 17, the resist layers 65a and 65b may be developed. Consequently, as illustrated in FIG. 17, first resist openings 67a may be patterned on the first surface 64a of the elongated metal plate 64. The first resist openings 67a may have opening shapes suitable for the openings of the first recesses 30 in a section along the first surface 20a. Second resist openings 67b may be patterned on the second surface 64b of the elongated metal plate 64. The second resist openings 67b may have opening shapes suitable for the openings of the second recesses 35 in a section along the second surface 20b.

A heat treatment process may be performed between the exposure process and the development process. In the heat treatment process, the resist layers 65a and 65b may be heated to increase the hardness of the resist layers 65a and 65b. In the heat treatment process, the resist layers 65a and 65b may be heated to increase the strength of adhesion between the resist layers 65a and 65b and the elongated metal plate 64. For example, the heat treatment process may be performed in an inert gas atmosphere at temperatures of 100° C. to 400° C. Examples of the inert gas include argon gas, helium gas, or nitrogen gas.

Figure 18:
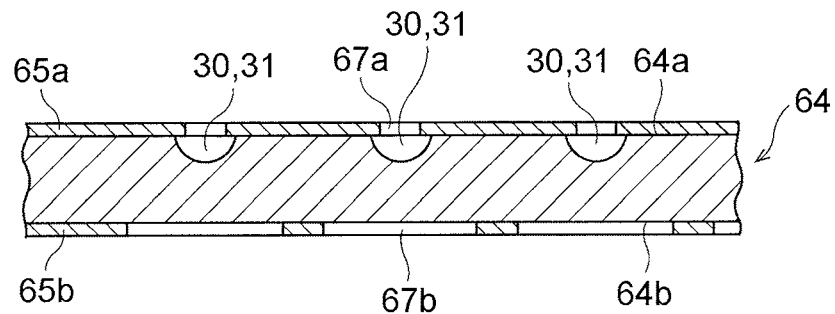
FIG. 18 is a first etching process for describing the example of the manufacturing method for the deposition mask illustrated in FIG. 6.

In the first etching process after the development process, as illustrated in FIG. 18, the first surface 64a of the elongated metal plate 64 may be etched by using a first etching solution. The first etching solution may etch regions that are exposed from the first resist openings 67a. For example, the first etching solution may be sprayed from a nozzle that faces the first surface 64a of the elongated metal plate 64 that is transported toward the first surface 64a of the elongated metal plate 64 via the first resist openings 67a. As a result, as illustrated in FIG. 18, the first etching solution progresses the corrosion of the regions of the elongated metal plate 64 that are exposed from the first resist openings 67a. Consequently, a large number of the first recesses 30 are formed on the first surface 64a of the elongated metal plate 64. Examples of the first etching solution may include a ferric chloride solution and an etching solution containing hydrochloric acid. The first etching solution progresses the corrosion not only in the normal direction N but also in a direction perpendicular to the normal direction N.

Figure 19:
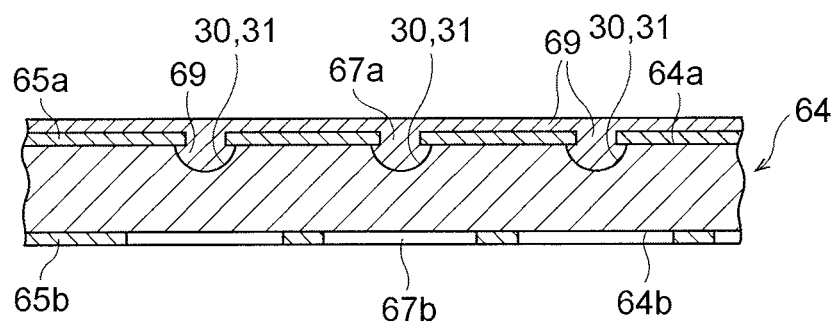
FIG. 19 illustrates a process of coating first recesses with resin for describing the example of the manufacturing method for the deposition mask illustrated in FIG. 6.

In a resin coating process after the first etching process, as illustrated in FIG. 19, the first recesses 30 and the first resist openings 67a may be coated with resin 69. The resin 69 may have resistance against a second etching solution that is used in the second etching process described later. In an example illustrated in FIG. 19, the first recesses 30 and the first resist openings 67a that are formed are coated with the resin 69, and the resist layer 65a is also coated with the resin 69. In this way, a layer composed of the resin 69 may be formed on the first surface 64a of the elongated metal plate 64.

Figure 20:
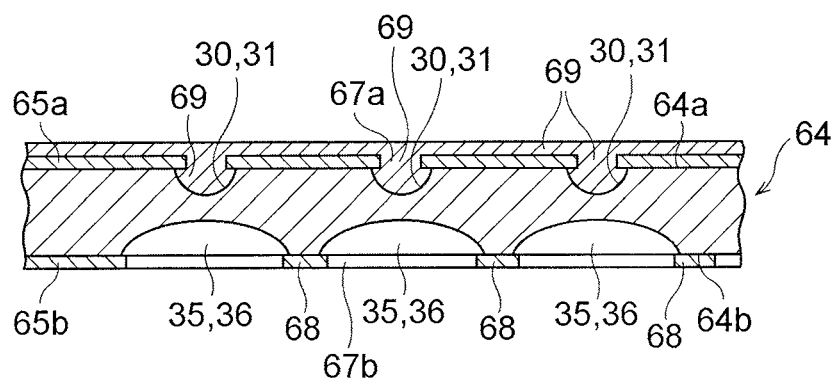
FIG. 20 illustrates a second etching process for describing the example of the manufacturing method for the deposition mask illustrated in FIG. 6.

In the second etching process after the resin coating process, as illustrated in FIG. 20, the second surface 64b of the elongated metal plate 64 may be etched by using the second etching solution. The second etching solution may etch regions that are exposed from the second resist openings 67b. For example, the second etching solution may be sprayed from a nozzle that faces the second surface 64b of the elongated metal plate 64 that is transported toward the second surface 64b of the elongated metal plate 64 via the second resist openings 67b. As a result, as illustrated in FIG. 20, the second etching solution progresses the corrosion of the regions of the elongated metal plate 64 that are exposed from the second resist openings 67b. Consequently, a large number of the second recesses 35 may be formed on the second surface 64b of the elongated metal plate 64. The second etching process may continue until the first recesses 30 and the second recesses 35 communicate with each other. Consequently, the through-holes 25 are formed. Examples of the second etching solution may include a ferric chloride solution and an etching solution containing hydrochloric acid as in the first etching solution described above. The second etching solution progresses the corrosion not only in the thickness direction of the elongated metal plate 64 but also in a direction perpendicular to the thickness direction of the elongated metal plate 64.

Figure 21:
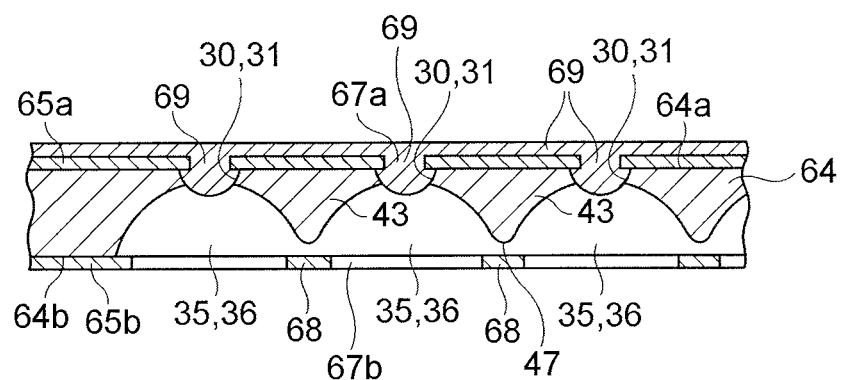
FIG. 21 illustrates the second etching process that follows FIG. 13 for describing the example of the manufacturing method for the deposition mask illustrated in FIG. 6.

The second etching process may continue until the second wall surfaces 36 of two second recesses 35 adjacent to each other in the first mask direction D1 and in the second mask direction D2 are connected to each other at the back of bridge portions 68 that are located between respective two of the second resist openings 67b. Consequently, as illustrated in FIG. 21, the ridge surfaces 47 that are convex toward the second surface 20b may be formed between respective two of the second wall surfaces 36 in each first mask region M1. However, the second etching process may end before the second wall surfaces 36 of the two second recesses 35 adjacent to each other in the third mask direction D3 described above are connected to each other at the back of the bridge portions 68. Consequently, as illustrated in FIG. 11, the top surfaces 44 that have the highest points 46 on the connection surfaces 45 can remain. In the second mask regions M2, the top surfaces 44 are formed between the second recesses 35 adjacent to each other. The top surfaces 44 are formed around the second recesses 35, and the second recesses 35 are surrounded by the top surfaces 44.

Figure 22:
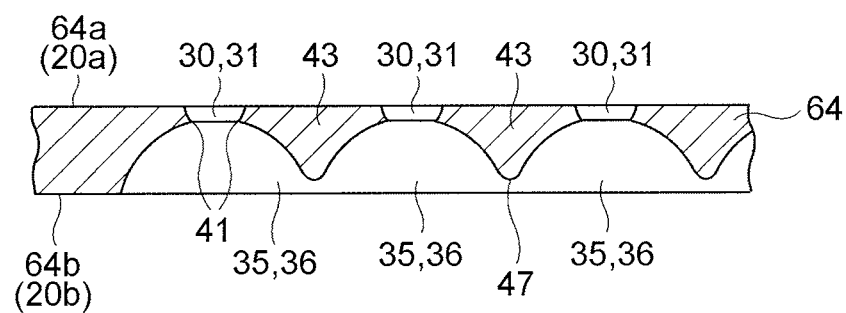
FIG. 22 illustrates a process of removing resin from the elongated metal plate for describing the example of the manufacturing method for the deposition mask illustrated in FIG. 6.

In a resin removal process after the second etching process, as illustrated in FIG. 22, the resin 69 is removed from the elongated metal plate 64. For example, the resin 69 may be removed by using an alkali stripping solution. In the case where the alkali stripping solution is used, as illustrated in FIG. 22, the resist layers 65a and 65b may be removed together with the resin 69. The resist layers 65a and 65b may be removed by using a stripping solution that differs from the stripping solution for stripping the resin 69 after the resin 69 is removed.

As illustrated in FIG. 14, the drive rollers 72 are rotatably driven, and consequently, the elongated metal plate 64 from which the resin 69 is removed is transported to a cutting device 73.

In a cutting process, the elongated metal plate 64 that has the large number of the through-holes 25 is cut by the cutting device 73. Consequently, the elongated metal plate 64 is divided into individual pieces, and the deposition mask 20 that has a predetermined length and a predetermined width and that has a sheet-like shape is obtained. The deposition mask 20 has the large number of the through-holes 25 that are formed in the above manner.

The deposition mask 20 according to the present embodiment is obtained in the above manner.

In the case where the deposition mask apparatus 10 according to the present embodiment is manufactured, the deposition masks 20 that are obtained in the above manner may be fixed to the frame 15. More specifically, the deposition masks 20 are fixed to the frame 15 with the second surfaces 20b of the deposition masks 20 being in contact with the first surface 15a of the frame 15. The ears 21A and 21B of the deposition masks 20 may be fixed to the frame 15 by, for example, spot welding.

When the deposition masks 20 are fixed to the frame 15, a tensile force in the second mask direction D2 may be applied thereto. The positions of the through-holes 25 may be adjusted for the frame 15 so as to be located within a permissible range from desired positions by applying the tensile force to the deposition masks 20.

The deposition mask apparatus 10 according to the present embodiment is obtained in the above manner.

A manufacturing method for the organic device 100 by mounting the deposition mask apparatus 10 on the deposition apparatus 80 will be described.

The manufacturing method for the organic device 100 may include a process of forming the organic layers 130 by attaching the deposition material 90 to the substrate 110 by using the deposition mask apparatus 10 described above. More specifically, the manufacturing method for the organic device 100 according to the present embodiment may include a preparation process, a position adjustment process, a close contact process, a deposition process, and a dividing process.

In the preparation process, the deposition mask apparatus 10 described above may be prepared. The deposition mask apparatus 10 is mounted on the deposition apparatus 80. The substrate 110 that has the first electrodes 120 described above may be prepared. For example, the first electrodes 120 may be formed in a manner in which a conductive layer for forming the first electrodes 120 is formed on the substrate 110 by, for example, a spattering method, and the conductive layer is subsequently patterned by, for example, a photolithography method. The insulating layer 160 that is located between two first electrodes 120 adjacent to each other in a plan view may be formed on the substrate 110.

In the position adjustment process after the preparation process, the positions of the deposition masks 20 of the deposition mask apparatus 10 are adjusted for the substrate 110. In the position adjustment process, the deposition mask apparatus 10 is supported by a support member, not illustrated, in the casing 81 of the deposition apparatus 80 illustrated in FIG. 5. The deposition mask apparatus 10 is not supported by the holder 85a of the rotation drive mechanism 85 and is located below the holder 85a. The substrate 110 is supported by another support member, not illustrated, in the casing 81. The substrate 110 is located between the deposition mask apparatus 10 and the holder 85a, and the substrate 110 and the deposition mask apparatus 10 are separated from each other. In this state, the positions of the through-holes 25 of the deposition masks 20 may be adjusted for the substrate 110.

In the close contact process after the position adjustment process, the deposition masks 20 of the deposition mask apparatus 10 may come into close contact with the substrate 110. The first surface 20a of each deposition mask 20 may come into close contact with the first surface 110a of the substrate 110. More specifically, the deposition mask apparatus 10 is moved toward the holder 85a of the rotation drive mechanism 85 and is stuck to the magnet 87 that is supported by the holder 85a of the rotation drive mechanism 85. Since the substrate 110 is interposed between the deposition mask 20 and the magnet 87, the deposition mask apparatus 10 is attracted to the substrate 110 due to the magnetic force of the magnet 87. In this way, the first surface 20a of the deposition mask 20 comes into close contact with the first surface 110a of the substrate 110.

Suitable multiple deposition masks 20 are used to form the organic layers 130A, 130B, and 130C and the first layers 140A and the second layers 140B of the second electrodes 140 as described later. When the deposition masks 20 are replaced, the preparation process, the position adjustment process, and the close contact process described above may be performed.

In the deposition process after the close contact process, the deposition layer is formed on the substrate 110. The deposition process may include an organic layer formation process of forming the organic layers 130A, 130B, and 130C and an electrode formation process of forming the second electrodes 140. The organic layers 130A, 130B, and 130C are examples of the deposition layer. The second electrodes 140 are other examples of the deposition layer.

In the organic layer formation process, the deposition material 90 is deposited on the substrate 110, and the organic layers 130A, 130B, and 130C are formed. The organic layers 130A, 130B, and 130C may be formed by a deposition method in which the suitable deposition masks 20 are used. The deposition material 90 passes through the frame opening 16 and the through-holes 25 of the deposition masks 20 and is consequently deposited on the substrate 110.

More specifically, the discharge portion 82 of the deposition apparatus 80 illustrated in FIG. 5 is driven, the pressure of the process space 81a in the casing 81 is decreased, and the vacuum atmosphere is obtained. The deposition source 83 is heated by the heater 84, and the deposition material 90 that is contained in the deposition source 83 vaporizes. The deposition material 90 vaporized passes through the frame opening 16 of the frame 15 and the through-holes 25 of the deposition masks 20 and reaches the first surface 110a of the substrate 110. The deposition material 90 that reaches the first surface 110a is attached to the hole transport layers that are formed on the first surface 110a. During deposition, the rotation drive portion 85b is driven, and the substrate 110 and the deposition mask apparatus 10 rotate. Consequently, the deposition material 90 is attached to the whole of a region of the substrate 110 in which the organic layers 130 are to be formed so as to be patterned, and the organic layers 130 having a desired pattern are formed.

In the deposition apparatus 80, the deposition material 90 that vaporizes from the deposition source 83 typically moves not only in the normal direction N toward the substrate 110 but also in a direction that greatly inclines with respect to the normal direction N. When the thickness t of each deposition mask 20 is great, the deposition material 90 that moves in the inclining direction is likely to be attached to the second surface 20b including the top surfaces 44, the second wall surfaces 36 of the second recesses 35, or the first wall surfaces 31 of the first recesses 30. As a result, the shadow described above occurs, the amount of the deposition material 90 that cannot pass through the through-holes 25 increases. In the deposition apparatus 80 that is rotatable as illustrated in FIG. 5, the deposition source 83 does not move, and the substrate 110 rotates. Consequently, the distance from the deposition source 83 to a position on the substrate 110 varies during deposition, the deposition material 90 can come to the position on the substrate 110 at various angles. For this reason, the occurrence of the shadow can be effectively inhibited by using the deposition masks 20 according to the present embodiment.

As for this, according to the present embodiment, the angles of inclination of the wall surfaces of the through-holes 25 with respect to the first surface 20a of the deposition mask 20 are small as described above. More specifically, the angles $\theta 3$ and $\theta 4$ that are formed between the inclination definition line L and the first surface 20a of the deposition mask 20 are 45° or less with the definition sections that are defined in the above manner passing through the highest point 46 of the top surfaces 44 corresponding to the highest point 46 of the connection surfaces 45. Consequently, the deposition material 90 can be inhibited from being attached to the second wall surfaces 36 of the second recess 35 and the second surface 20b also at positions on the second wall surfaces 36 near the top surfaces 44 at which the deposition material 90 is likely to be attached. Even when the deposition material 90 that comes from the deposition source 83 greatly inclines with respect to the normal direction N, the deposition material 90 can be inhibited from being attached to the second wall surfaces 36. Consequently, even the deposition material 90 that comes in the direction that greatly inclines with respect to the normal direction N can pass through the through-portions 42. The deposition material 90 that passes through the through-portions 42 can reach the first surface 110a of the substrate 110.

According to the present embodiment, the angle that is formed between the first surface 20a and the inclination definition line L in a definition section that passes through a freely selected point on the connection surfaces 45, more specifically, the ridge surfaces 47 is 45° or less. Consequently, the deposition material 90 can be inhibit from being attached to the second wall surfaces 36 and the second surface 20b over the entire circumference of the second recesses 35 in a plan view. More specifically, even when the deposition material that comes in a freely selected direction in a plan view comes at an angle of 45° or less with respect to the first surface 20a, the deposition material 90 can be inhibited from being attached to the second surface 20b. For this reason, the amount of the deposition material 90 that can pass through the through-portions 42 can be increased.

The organic layers 130A, 130B, and 130C are formed across the first electrodes 120 and the insulating layers 160 adjacent to the first electrodes 120. The organic layers 130A, 130B, and 130C adjacent to each other may overlap on the insulating layers 160 although this is not illustrated.

According to the present embodiment, each of the organic layers 130A, 130B, and 130C is formed on a desired hole transport layer of the substrate 110. The organic layers 130A, 130B, and 130C may be separately formed by using the suitable deposition material 90. More specifically, the organic layers 130A, 130B, and 130C in respective colors are formed on the respective display regions of the substrate 110. For example, an organic light-emitting material for red color, an organic light-emitting material for green color, and an organic light-emitting material for blue color are deposited on the single substrate 110. In this way, the organic layers 130A, 130B, and 130C are formed on the respective display regions of the substrate 110. The organic layers 130A, 130B, and 130C may be formed on the substrate 110 in the desired order. The organic layers 130A are formed by using the deposition mask 20 that has the through-holes 25 suitable for the pattern of the organic layers 130A. The organic layers 130B and 130C in the other colors are formed by using the deposition masks 20 that have the through-holes 25 suitable for the respective colors.

After the organic layers 130A, 130B, and 130C are formed, the electron transport layers and the electron injection layers are formed on the organic layers 130A, 130B, and 130C.

After the electron transport layers and the electron injection layers are formed, the second electrodes 140 are formed in the electrode formation process. The second electrodes 140 may be formed so as to cover the respective organic layers 130A, 130B, and 130C. The second electrodes 140 are formed across the first electrodes 120 and the insulating layers 160 adjacent to the first electrodes 120 on the organic layers 130A, 130B, and 130C.

More specifically, a process of forming the first layers 140A of the second electrodes 140 may be performed by a deposition method in which the suitable deposition mask 20 is used. For example, the first layers 140A may be formed by depositing a conductive material such as metal on the organic layers 130 by using the suitable deposition mask 20. The first layers 140A may be formed by the deposition apparatus 80 that is rotatable as illustrated in FIG. 5 as in the organic layers 130A, 130B, and 130C.

Subsequently, a process of forming the second layers 140B of the second electrodes 140 may be performed by a deposition method in which another deposition mask 20 is used. For example, the second layers 140B may be formed by depositing a conductive material such as metal on the organic layers 130 by using the stable deposition mask 20. The second layers 140B may be formed by the deposition apparatus 80 that is rotatable as illustrated in FIG. 5 as in the organic layers 130A, 130B, and 130C.

In this way, as illustrated in FIG. 3 and FIG. 4, the second electrodes 140 that include the first layers 140A and the second layers 140B are formed. The order in which the first layers 140A and the second layers 140B are formed is not particularly limited. For example, the first layers 140A may be formed after the second layers 140B are formed.

After the electrode formation process, the flattening layer and the sealing layer described above are formed on the second electrodes 140. In this way, elements such as the organic layers 130A, 130B, and 130C that are disposed on the substrate 110 are sealed by the sealing layer.

In the dividing process after the flattening layer and the sealing layer are formed, the substrate 110 may be divided for every display region of the organic device 100. In this case, for example, the substrate 110 is divided between the display regions adjacent to each other by using a dicing saw.

In this way, the organic device 100 that has the display regions in which the organic layers 130A, 130B, and 130C in the respective colors are formed on the substrate 110 is obtained.

According to the present embodiment, the first mask region M1 has the first surface remaining ratio that represents the remaining area ratio of the second surface 20b, and the second mask region M2 has the second surface remaining ratio that represents the remaining area ratio of the second surface 20b as described above. The second surface remaining ratio is higher than the first surface remaining ratio. Consequently, the area of the second recesses 35 that occupy the second mask region M2 is decreased, and the remaining area of the second surface 20b can be increased. For this reason, a thick portion of the deposition mask 20 can be increased. As a result, the mechanical strength of the deposition mask 20 can be increased.

According to the present embodiment, the first mask region M1 has the first aperture ratio that represents the area ratio of the through-holes 25, and the second mask region M2 has the second aperture ratio that represents the area ratio of the through-holes 25. The second aperture ratio is lower than the first aperture ratio. Consequently, an area in which the deposition material 90 that passes through the through-holes 25 and that is attached to the substrate 110 is deposited can be decreased in the second display region 102 of the organic device 100. For this reason, as for the substrate 110, the area of the deposition layer that is included in, for example, the organic layers 130 and the second electrodes 140 can be decreased, and the second transmittance of the second display region 102 can be increased.

According to the present embodiment, the definition sections are defined as sections that pass through the freely selected respective point on the connection surfaces 45, that are perpendicular to the first surface 20a of the deposition mask 20, and that pass through the respective point on the ridge lines 41 such that the distances from the freely selected respective points are shortest in a plan view. The inclination definition lines are defined as straight lines that are in contact with the connection surfaces 45 and the ridge lines 41 in the respective definition sections. The angles that are formed between the inclination definition lines L and the first surface 20a with the definition sections passing through the highest point 46 on the connection surfaces 45 are 45° or less. Consequently, the deposition material 90 can be inhibited from being attached to the top surfaces 44 also at positions on the second wall surfaces 36 of the second recesses 35 near the highest points 46 at which the deposition material 90 is likely to be attached. For this reason, the occurrence of the shadow can be reduced.

According to the present embodiment, the connection surfaces 45 have four highest points 46, and four definition sections that pass through the respective highest point 46 among the four highest points 46 are defined. An angle that is formed between the first surface 20a and the inclination definition line L in at least one definition section among the four definition sections is 45° or less. Consequently, the deposition material 90 can be inhibited from being attached to the second wall surfaces 36 and the second surface 20b at positions on the second wall surfaces 36 near at least one of the highest points 46 among the four highest points 46 at which the deposition material 90 is likely to be attached. For this reason, the occurrence of the shadow can be reduced.

According to the present embodiment, the highest points 46 of the connection surfaces 45 are flush with the second surface 20b of the deposition mask 20 in the normal direction N. In this case, although the angle that is formed between the inclination definition line L and the first surface 20a is likely to increase, the angle can be set to 45° or less. Consequently, the deposition material 90 can be effectively inhibited from being attached to the second wall surfaces 36 and the second surface 20b also at positions on the second wall surfaces 36 near the highest points 46 at which the deposition material 90 is likely to be attached. For this reason, the occurrence of the shadow can be effectively reduced.

According to the present embodiment, as for the inclination definition line L, the angle that is formed between the first surface 20a and the inclination definition line L in a definition section that passes through a freely selected point on the connection surfaces 45 is 45° or less. Consequently, the deposition material 90 can be inhibited from being attached to the second wall surfaces 36 and the second surface 20b over the entire circumference of the second recesses 35 in a plan view. For this reason, the occurrence of the shadow can be further reduced.

The embodiment described above can be modified in various ways. Modifications will now be described with reference to the drawings as needed. In the following description and the drawings that are used for the description, a portion that has the same structure as a portion according to the embodiment described above is designated by reference characters like to the reference characters that are used for the portion according to the embodiment described above, and a duplicated description is omitted. In the case where the action and effect according to the embodiment described above are clearly achieved also according to the modifications, the description thereof is omitted in some cases.

A first modification will be described.

In an example according to the present embodiment described above, the connection surfaces 45 that surround one of the second recesses 35 that is located in the first mask region M1 have the four top surfaces 44. However, the present disclosure is not limited thereto. The number of the top surfaces 44 that the connection surfaces 45 have may be one, two, three, or five or more. Also, in this case, the angle θ3 that is formed between the first surface 20a and the inclination definition line L in one of the definition sections among the definition sections suitable for the respective top surfaces 44 may be 25° or more and 45° or less.

A second modification will be described.

In an example according to the present embodiment described above, the top surfaces 44 that are flush with the second surface 20b of the deposition mask 20 in the normal direction N have the highest points 46 of the connection surfaces 45 that are located in the first mask regions M1. However, the present disclosure is not limited thereto. The highest points 46 may not be flush with the second surface 20b, provided that the highest points 46 are nearest to the second surface 20b among points on the connection surfaces 45.

Figure 23:
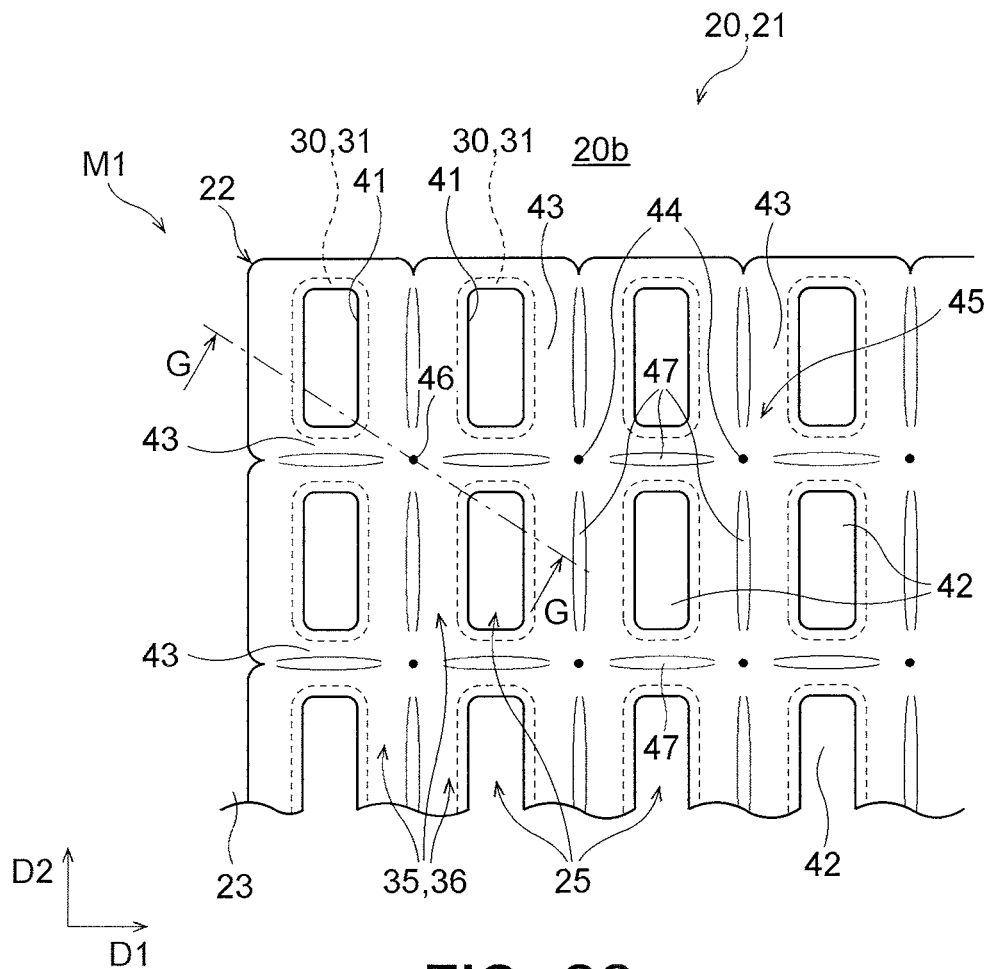
FIG. 23 is an enlarged partial plan view of a modification to the deposition mask in FIG. 8.
Figure 24:
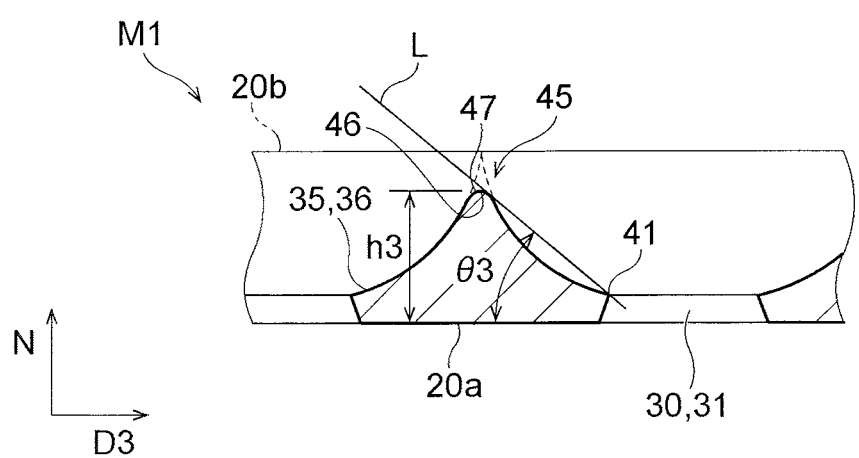
FIG. 24 is a sectional view taken along line G-G in FIG. 23.

For example, as illustrated in FIG. 23 and FIG. 24, the highest points 46 may be closer to the first surface 20a than the second surface 20b. The angle θ3 that is formed between the first surface 20a of the deposition mask 20 and the inclination definition line L in the definition sections that pass through the highest points 46 of the connection surfaces 45 may be 25° or more and 45° or less. Consequently, the deposition material 90 can be inhibited from being attached to the second wall surfaces 36 of the second recess 35 and the connection surface 45 at positions on the second wall surfaces 36 near the highest points 46 at which the deposition material 90 is likely to be attached. For this reason, the occurrence of the shadow can be reduced. In examples illustrated in FIG. 23 and FIG. 24, the highest points 46 may be the vertexes of the ridge surfaces 47 that are included in the connection surfaces 45 and that curve. In the example illustrated in FIG. 24, the height h3 of each of the highest points 46 of the connection surfaces 45 may be greater than the height h1 illustrated in FIG. 9 and may be greater than the height h2 illustrated in FIG. 10. In the case where the connection surfaces 45 illustrated in FIG. 23 and FIG. 24 are formed, the second etching process may continue until the second wall surfaces 36 of two second recesses 35 adjacent to each other in the third mask direction D described above are connected to each other at the back of the bridge portions 68.

A third modification will be described.

In an example according to the present embodiment described above, the multiple through-holes 25 that are located in the first mask regions M1 and in the second mask regions M2 are arranged in parallel. However, the present disclosure is not limited thereto. For example, as illustrated in FIG. 25, the multiple through-holes 25 may be formed in a staggered arrangement.

Figure 25:
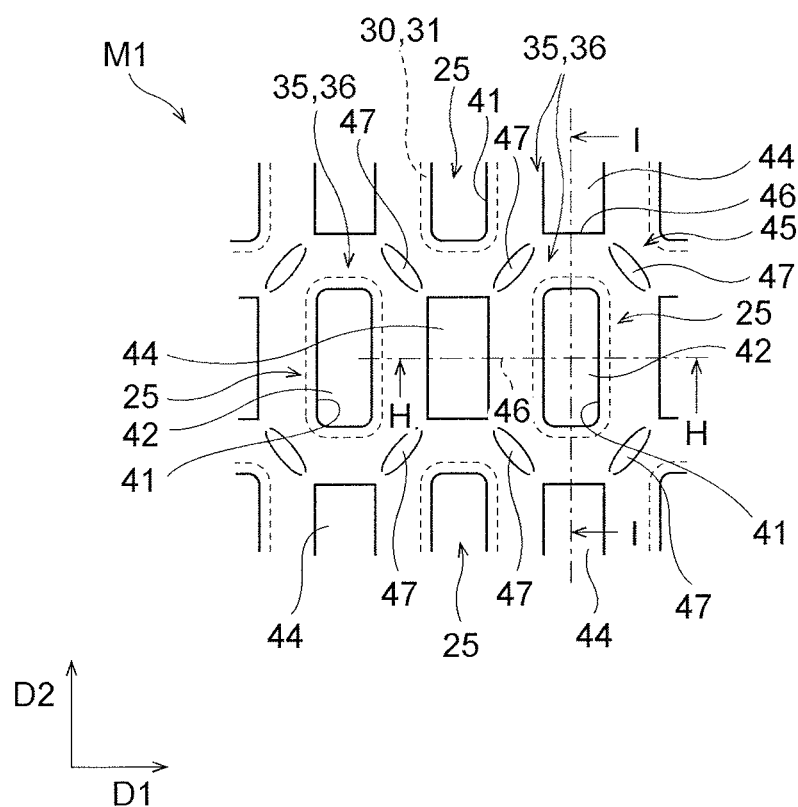
FIG. 25 is an enlarged partial plan view of a modification to the deposition mask in FIG. 8.

For example, as illustrated in FIG. 25, some of the through-holes 25 that define a single column extending in the first mask direction D1 and some of the through-holes 25 that define another column adjacent to the column in the second mask direction D2 may not be aligned in the second mask direction D2. In an example illustrated in FIG. 25, some of the through-holes 25 that define a single column and some of the through-holes 25 that define another column adjacent thereto are misaligned in the first mask direction D1, and the amount of misalignment is half of the array pitch C1 in the first mask direction D1.

In the example illustrated in FIG. 25, the connection surface 45 that surround one of the second recesses 35 have four top surfaces 44. The four top surfaces 44 are located on both sides of the second recess 35 in the first mask direction D1 and on both sides of the second recess 35 in the second mask direction D2. The top surfaces 44 illustrated in FIG. 25 are flush with the second surface 20b of the deposition mask 20 in the normal direction N. The top surface 44 may be flat as in the second surface 20b. Portions of the connection surfaces 45 other than the top surfaces 44 may be formed as the ridge surfaces 47 so as to curve toward the second surface 20b and so as to have a convex shape.

Four definition sections that pass through the highest point 46 that is located on the respective top surface 44 among the four top surfaces 44 are defined. FIG. 25 illustrates examples of the definition sections that pass through the highest point 46 on the top surfaces 44 by using line H-H and line I-I.

The line H-H extends in the first mask direction D1. The line H-H may pass through the center of one of the through-holes 25. The highest points 46 may be points on the top surfaces 44 closest to the ridge lines 41 in a plan view. As illustrated in FIG. 25, in the case where edges of the top surfaces 44 that face the ridge lines 41 and that extend in the second mask direction D2 in a plan view are parallel with portions of the ridge lines 41 extending in the second mask direction D2, freely selected points on the edges of the top surfaces 44 may be used as the highest points 46 to define the definition sections. The angle θ1 that is formed between the first surface 20a and the inclination definition line L in the definition section illustrated by using the line H-H may be 25° or more and 45° or less.

The line I-I extends in the second mask direction D2. The line I-I may pass through the through-hole 25. The highest points 46 may be points on the top surfaces 44 closest to the ridge lines 41 in a plan view. As illustrated in FIG. 25, in the case where edges of the top surface 44 that face the ridge lines 41 and that extend in the first mask direction D1 in a plan view are parallel with portions of the ridge lines 41 extending in the first mask direction D1, freely selected points on the edges of the top surfaces 44 may be used as the highest points 46 to define the definition sections. The angle θ2 that is formed between the first surface 20a and the inclination definition line L in the definition section illustrated by using the line I-I may be 25° or more and 45° or less.

An angle that is formed between the first surface 20a and the inclination definition line L in a definition section that passes through a freely selected point on the connection surfaces 45 outside the top surfaces 44 may be 25° or more and 45° or less.

Even in the case where the multiple through-holes 25 are formed in a staggered arrangement, the highest points 46 may be closer to the first surface 20a than the second surface 20b.

A fourth modification will be described.

In an example according to the present embodiment described above, the organic layers 130A, 130B, and 130C of the organic device 100 are formed by the deposition apparatus 80 that is rotatable as illustrated in FIG. 5. However, the present disclosure is not limited thereto. The organic layers 130A, 130B, and 130C may be formed by the deposition apparatus 80 that is freely selected such as the deposition apparatus 80 that includes the deposition source 83 that is movable. Similarly, in an example described above, the first layers 140A and the second layers 140B that are included in the second electrodes 140 of the organic device 100 are formed by the deposition apparatus 80 that is rotatable as illustrated in FIG. 5. However, the present disclosure is not limited thereto. The first layers 140A and second layers 140B may be formed by the deposition apparatus 80 that is freely selected such as the deposition apparatus 80 that includes the deposition source 83 that is movable.

A fifth modification will be described.

In an example according to the present embodiment described above, the second electrodes 140 of the organic device 100 include the first layers 140A and the second layers 140B. However, the present disclosure is not limited thereto. For example, each second electrode 140 may be formed so as to be continuous across two organic layers adjacent to each other in a plan view among the organic layers 130A, 130B, and 130C. The second electrode 140 may be formed as a single layer. Alternatively, the second electrode 140 may include three layers. In this case, the layers of the second electrode 140 may overlap so as to face the organic layers 130A to 130C.

A sixth modification will be described.

According to the present embodiment described above, the structures of the connection surfaces 45 are freely selected provided that the first surface remaining ratio of the first mask region M1 is higher than the second surface remaining ratio of the second mask region M2. In this case, the connection surface 45 that surround one of the second recesses 35 that are located in the first mask region M1 may have a single or multiple top surfaces 44 or may not have the top surfaces 44. In the case where the connection surfaces 45 do not have the top surfaces 44, the first surface remaining ratio may be zero. The second surface 20b may not remain around one of the second recesses 35 that are located in the second mask region M2. For example, the connection surface 45 that surround one of the second recesses 35 that are located in the second mask region M2 may have the ridge surfaces 47. In this case, the connection surfaces 45 in the second mask region M2 may have a single or multiple top surfaces 44.

A seventh modification will be described.

In an example according to the present embodiment described above, the first surface remaining ratio of the first mask region M1 is higher than the second surface remaining ratio of the second mask region M2. However, the present disclosure is not limited thereto. For example, the relationship in magnitude between the first surface remaining ratio and the second surface remaining ratio are not limited provided that the angle that is formed between the inclination definition line L and the first surface 20a is 25° or more and 45° or less with a definition section passing through one of the highest points 46. In this case, the deposition material 90 can be inhibited from being attached to the deposition mask 20, and the occurrence of the shadow can be reduced.

The modifications to the embodiment described above are described above. Naturally, multiple modifications may be appropriately combined and used.

The invention claimed is:

1. A deposition mask comprising:
    a first surface;
    a second surface that is located opposite the first surface; and
    two or more through-holes that extend from the first surface to the second surface,
    wherein each of the through-holes includes a first recess that is located at the first surface, a second recess that is located at the second surface and that is in communication with the first recess, and a ridge line that is connected to a wall surface of the first recess and a wall surface of the second recess and that extends inward from the wall surface of the first recess and the wall surface of the second recess in the through-hole,
    wherein the ridge line is closer to the first surface than the second surface,
    wherein the deposition mask has a first mask region having a first surface remaining ratio that represents a remaining area ratio of the second surface and a second mask region having a second surface remaining ratio that represents a remaining area ratio of the second surface and that is higher than the first surface remaining ratio, and
    wherein when a first direction and a second direction are defined in a plan view, parts of the first mask region are located on both sides of the second mask region in the first direction, and another part of the first mask region is located on at least one side of the second mask region in the second direction.

2. The deposition mask according to claim 1, wherein the first mask region has a first aperture ratio that represents an area ratio of the through-holes, and
    wherein the second mask region has a second aperture ratio that represents an area ratio of the through-holes and that is lower than the first aperture ratio.

3. The deposition mask according to claim 1, wherein a sash bar that has a connection surface that connects the wall surfaces is located between the wall surfaces of the second recesses adjacent to each other,
    wherein the second recess is surrounded by the connection surface in a plan view,
    wherein the connection surface that surrounds the second recess in a plan view has a highest point closest to the second surface, and
    wherein an angle that is formed between an inclination definition line and the first surface is 25° or more and 45° or less with a definition section passing through the highest point, where the definition section is a section that passes through a freely selected point on the connection surface, that is perpendicular to the first surface, and that passes through a point on the ridge line such that a distance from the freely selected point is shortest in a plan view, and the inclination definition line is a straight line that is in contact with the connection surface and the ridge line in the definition section.

4. The deposition mask according to claim 3, wherein the connection surface that surrounds the second recess has two or more of the highest points, wherein two or more of the definition sections that pass through the respective highest point of the two or more of the highest points are defined, and wherein an angle that is formed between the first surface and the inclination definition line in at least one definition section of the two or more of the definition sections is 25° or more and 45° or less.

5. The deposition mask according to claim 3, wherein the highest point is flush with the second surface in a direction perpendicular to the first surface.

6. The deposition mask according to claim 5, wherein the connection surface includes a top surface that is included in the second surface that remains, and wherein the highest point is a point on the top surface closest to the ridge line in a plan view.

7. The deposition mask according to claim 3, wherein an angle that is formed between the first surface and the inclination definition line in the definition section that passes through the freely selected point on the connection surface is 25° or more and 45° or less.

8. The deposition mask according to claim 1, wherein the two or more through-holes are arranged in the first direction in a plan view, and wherein an array pitch of the through-holes that are located in the first mask region and that are adjacent to each other in the first direction is 20 μm or more and 170 μm or less.

9. The deposition mask according to claim 8, wherein the two or more through-holes are arranged in the second direction perpendicular to the first direction in a plan view, and wherein an array pitch of the through-holes that are located in the first mask region and that are adjacent to each other in the second direction is 20 μm or more and 170 μm or less.

10. The deposition mask according to claim 1, wherein a thickness of the deposition mask is 5 μm or more and 35 μm or less.

11. The deposition mask according to claim 1, wherein other parts of the first mask region are located on both sides of the second mask region in the second direction.

12. A deposition mask apparatus comprising:
a frame that has a frame opening; and
the deposition mask according to claim 1 that is fixed to the frame and that includes the through-holes that overlap the frame opening in a plan view.

13. A deposition apparatus comprising:
a deposition source that vaporizes a deposition material; and
the deposition mask apparatus according to claim 12 that faces the deposition source.

14. The deposition apparatus according to claim 13, comprising:

a rotation drive mechanism that rotates the deposition mask with respect to the deposition source.

15. A method of manufacturing method for an organic device, the method comprising:
providing a deposition mask apparatus comprising a frame having a frame opening, and a deposition mask, the deposition mask comprising
a first surface,
a second surface that is located opposite the first surface, and
two or more through-holes that extend from the first surface to the second surface,
wherein each of the through-holes includes a first recess that is located at the first surface, a second recess that is located at the second surface and that is in communication with the first recess, and a ridge line that is connected to a wall surface of the first recess and a wall surface of the second recess and that extends inward from the wall surface of the first recess and the wall surface of the second recess in the through-hole,
wherein the ridge line is closer to the first surface than the second surface,
wherein the deposition mask has a first mask region having a first surface remaining ratio that represents a remaining area ratio of the second surface and a second mask region having a second surface remaining ratio that represents a remaining area ratio of the second surface and that is higher than the first surface remaining ratio,
wherein when a first direction and a second direction are defined in a plan view, parts of the first mask region are located on both sides of the second mask region in the first direction and another part of the first mask region is located on at least one side of the second mask region in the second direction, and
wherein the deposition mask is fixed to the frame so that the through-holes overlap the frame opening in a plan view;
adhering the deposition mask of the deposition mask apparatus to a substrate; and
forming a deposition layer by depositing a deposition material on the substrate so that the deposition material passes through the frame opening and the through-holes of the deposition mask.

16. The method according to claim 15, wherein the forming of the deposition layer includes rotating the deposition mask apparatus and the substrate with respect to a deposition source that vaporizes the deposition material.

17. The method according to claim 15, wherein in the deposition mask, other parts of the first mask region are located on both sides of the second mask region in the second direction.

* * * * *